US012575397B2

(12) United States Patent (10) Patent No.: US 12,575,397 B2

Wu et al. (45) Date of Patent: Mar. 10, 2026

(54) METAL LINES OF HYBRID HEIGHTS

(71) Applicant: TAIWAN SEMICONDUCTOR MANUFACTURING COMPANY, LTD., Hsinchu (TW)

(72) Inventors: Chia-Tien Wu, Taichung (TW); Wei-Chen Chu, Taichung (TW); Yu-Chieh Liao, Taoyuan County (TW); Hsin-Ping Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 878 days.

(21) Appl. No.: 17/832,584

(22) Filed: Jun. 4, 2022

(65) Prior Publication Data

US 2023/0275018 A1 Aug. 31, 2023

Related U.S. Application Data

(60) Provisional application No. 63/314,051, filed on Feb. 25, 2022.

(51) Int. Cl.
H01L 23/522 (2006.01)
G11C 11/412 (2006.01)
(Continued)

(52) U.S. Cl.
CPC ........ H01L 23/5226 (2013.01); G11C 11/412 (2013.01); G11C 11/417 (2013.01);
(Continued)

(58) Field of Classification Search
CPC ........... H01L 23/5226; H01L 21/76816; H01L 21/76831; H01L 21/76877; H01L 23/528; H01L 23/53252; H01L 23/5222; H01L 23/5283; H01L 23/53295; H01L 21/76834; H01L 21/76885; H01L 23/5286;
(Continued)

(56) References Cited

U.S. PATENT DOCUMENTS 8,605,523 B2 12/2013 Tao et al.
8,630,132 B2 1/2014 Cheng et al.
(Continued)

FOREIGN PATENT DOCUMENTS

CN 102054839 A 5/2011
KR 20010007566 A 1/2001
(Continued)

*Primary Examiner* — Cuong B Nguyen
(74) *Attorney, Agent, or Firm* — Haynes and Boone, LLP

(57) ABSTRACT

The present disclosure provides a method of fabricating a semiconductor device. The method includes forming a first interconnect layer over a substrate, the first interconnect layer including a first conductive feature and a second conductive feature, forming a patterned mask on the first interconnect layer, one or more openings in the patterned mask overlaying the second conductive feature, recessing the second conductive feature through the one or more openings in the patterned mask, and forming a second interconnect layer over the first interconnect layer. The second interconnect layer includes a first via in contact with the first conductive feature and a second via in contact with the second conductive feature.

20 Claims, 30 Drawing Sheets

(51) Int. Cl.

| | |
|---|---|
| *G11C 11/417* | (2006.01) |
| *H01L 21/768* | (2006.01) |
| *H01L 23/528* | (2006.01) |
| *H01L 23/532* | (2006.01) |
| *H10B 10/00* | (2023.01) |

(52) U.S. Cl.
CPC .. *H01L 21/76816* (2013.01); *H01L 21/76831* (2013.01); *H01L 21/76877* (2013.01); *H01L 23/528* (2013.01); *H01L 23/53252* (2013.01); *H10B 10/12* (2023.02)

(58) Field of Classification Search
CPC ......... H01L 21/76897; H01L 21/76895; H01L 21/76892; H01L 21/32051; H01L 21/32139; H01L 21/76837; G11C 11/412; G11C 11/417; H10B 10/12; H10D 89/10
See application file for complete search history.

(56) References Cited

U.S. PATENT DOCUMENTS

| | | | |
|---|---|---|---|
| 8,760,948 | B2 | 6/2014 | Tao et al. |
| 2012/0267727 | A1 | 10/2012 | Ho |
| 2014/0032871 | A1 | 1/2014 | Hsu et al. |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0233330 | A1 | 8/2014 | Ko et al. |
| 2014/0241077 | A1 | 8/2014 | Katoch et al. |
| 2014/0269114 | A1 | 9/2014 | Yang et al. |
| 2016/0268195 | A1* | 9/2016 | Lee ................... H01L 21/02126 |
| 2018/0315653 | A1 | 11/2018 | Briggs et al. |

FOREIGN PATENT DOCUMENTS

| | | | |
|---|---|---|---|
| KR | 20050007531 | A | 1/2005 |
| TW | 451414 | B | 8/2001 |
| TW | I293493 | B | 2/2008 |

* cited by examiner

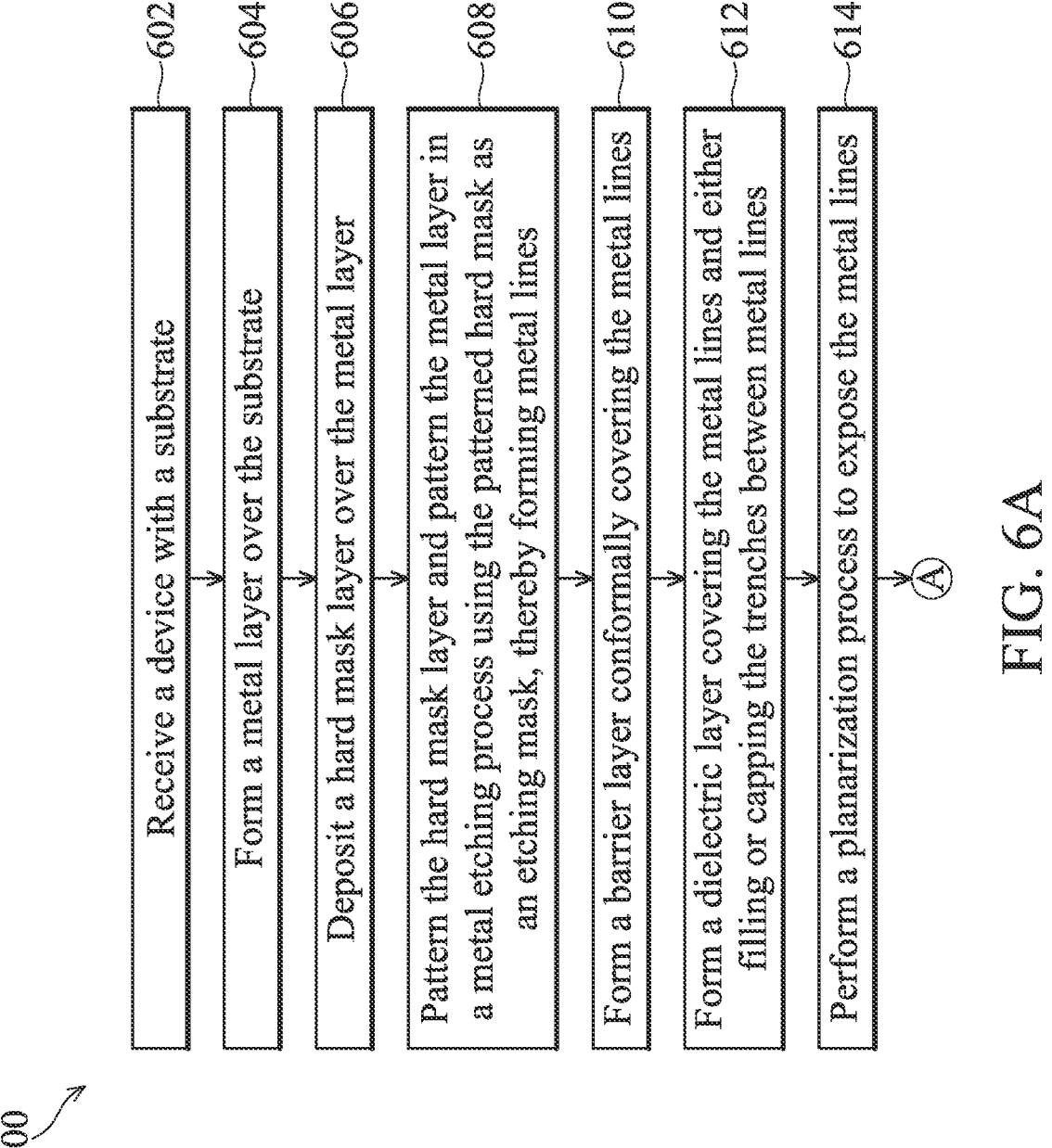

600

602 — Receive a device with a substrate

604 — Form a metal layer over the substrate

606 — Deposit a hard mask layer over the metal layer

608 — Pattern the hard mask layer and pattern the metal layer in a metal etching process using the patterned hard mask as an etching mask, thereby forming metal lines 610 — Form a barrier layer conformally covering the metal lines 612 — Form a dielectric layer covering the metal lines and either filling or capping the trenches between metal lines 614 — Perform a planarization process to expose the metal lines (A)

FIG. 6A

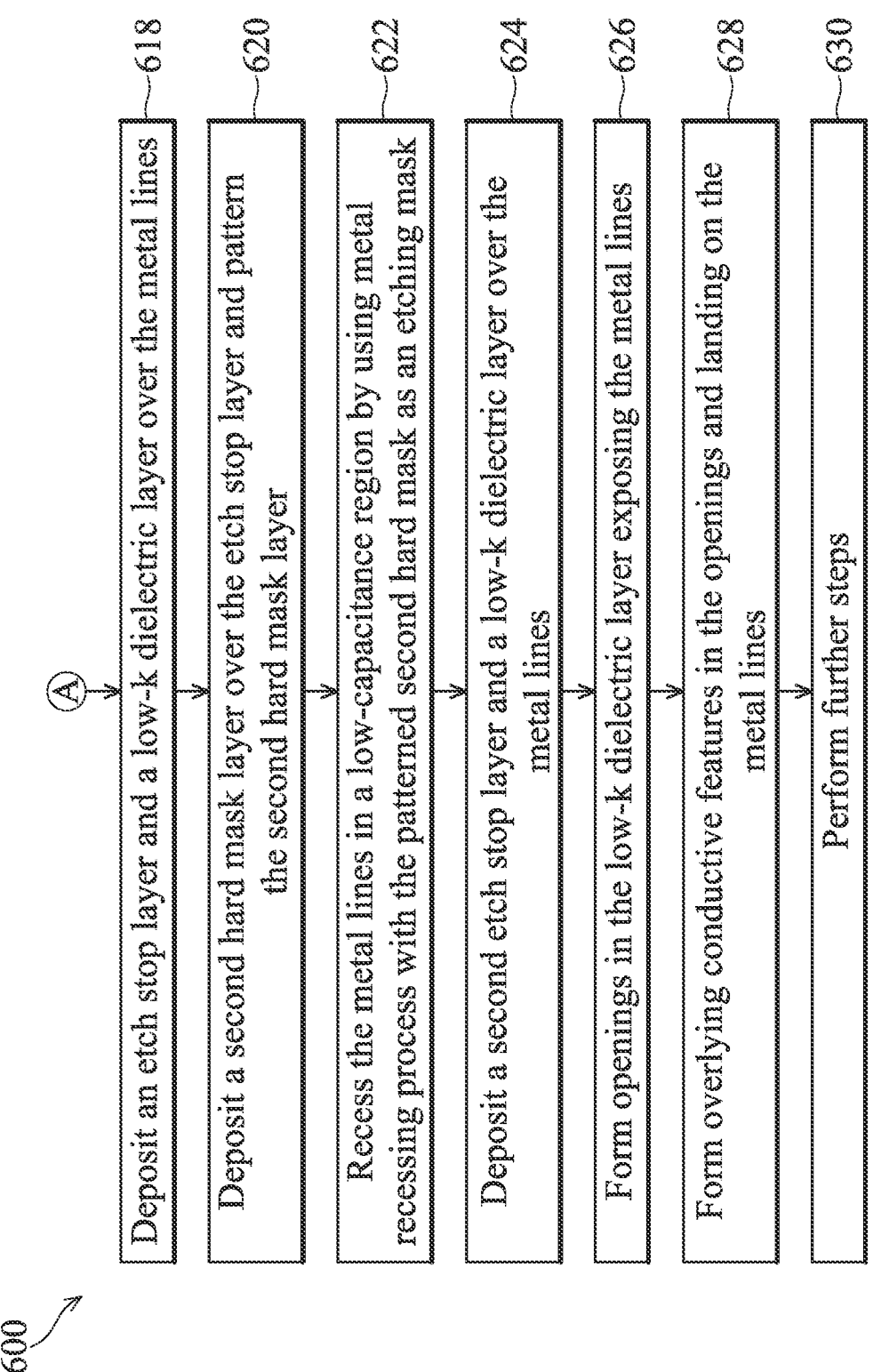

600

(A)

Deposit an etch stop layer and a low-k dielectric layer over the metal lines — 618

Deposit a second hard mask layer over the etch stop layer and pattern the second hard mask layer — 620

Recess the metal lines in a low-capacitance region by using metal recessing process with the patterned second hard mask as an etching mask — 622

Deposit a second etch stop layer and a low-k dielectric layer over the metal lines — 624

Form openings in the low-k dielectric layer exposing the metal lines — 626

Form overlying conductive features in the openings and landing on the metal lines — 628

Perform further steps — 630

FIG. 6B

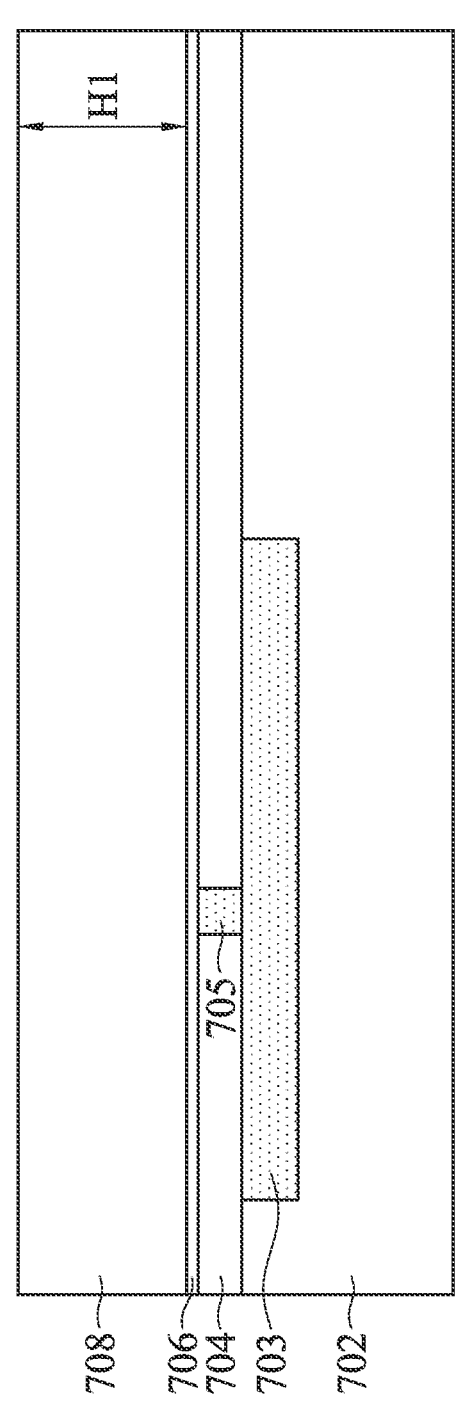
FIG. 8

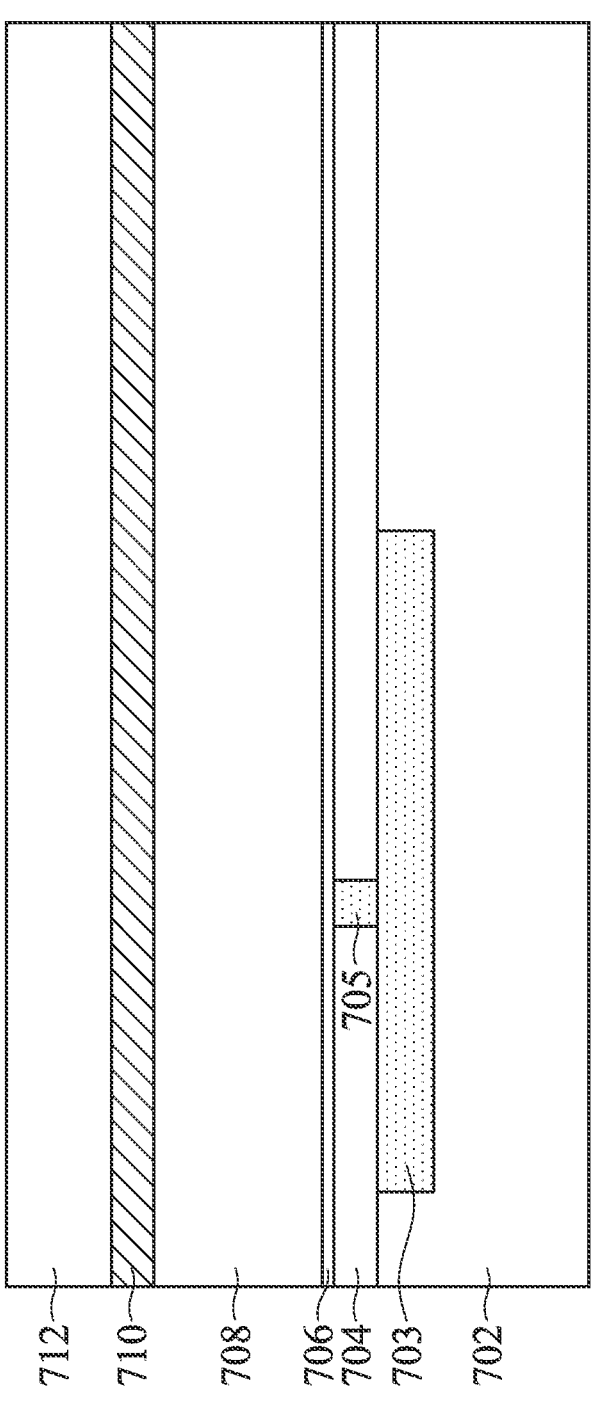
FIG. 9

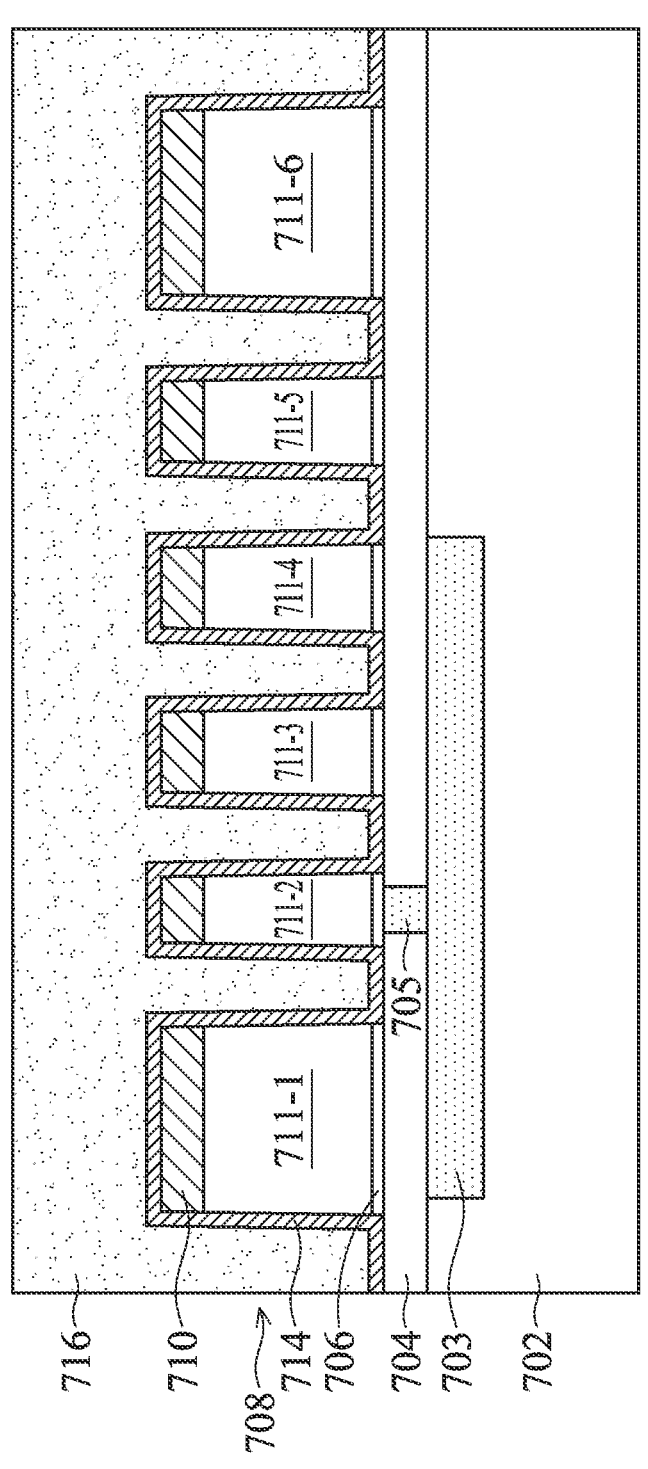
FIG. 12

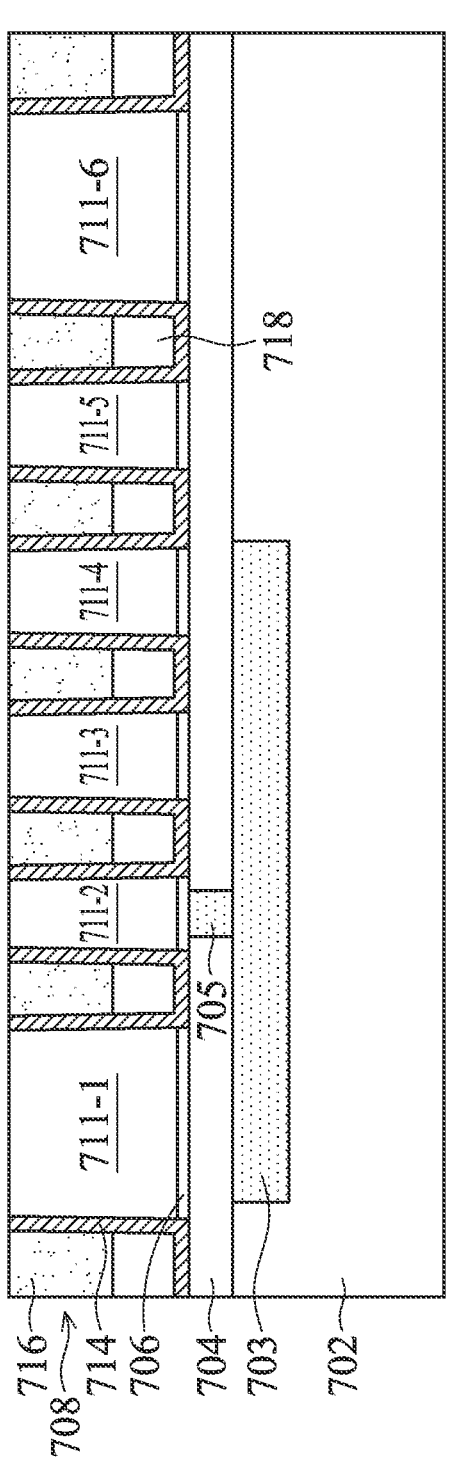
FIG. 14

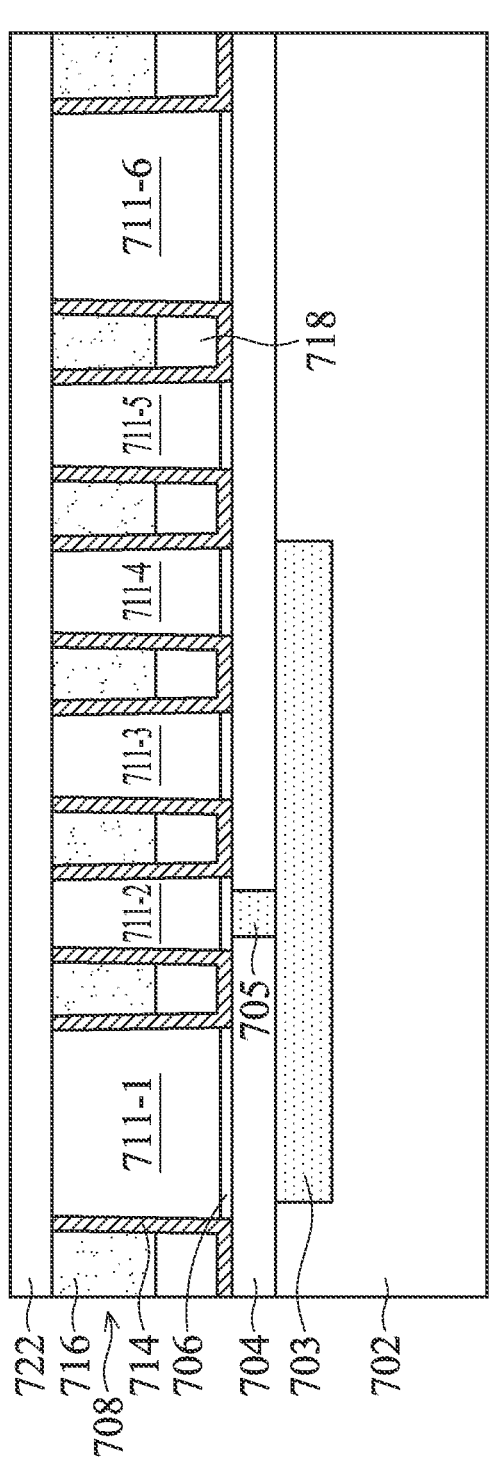
FIG. 15

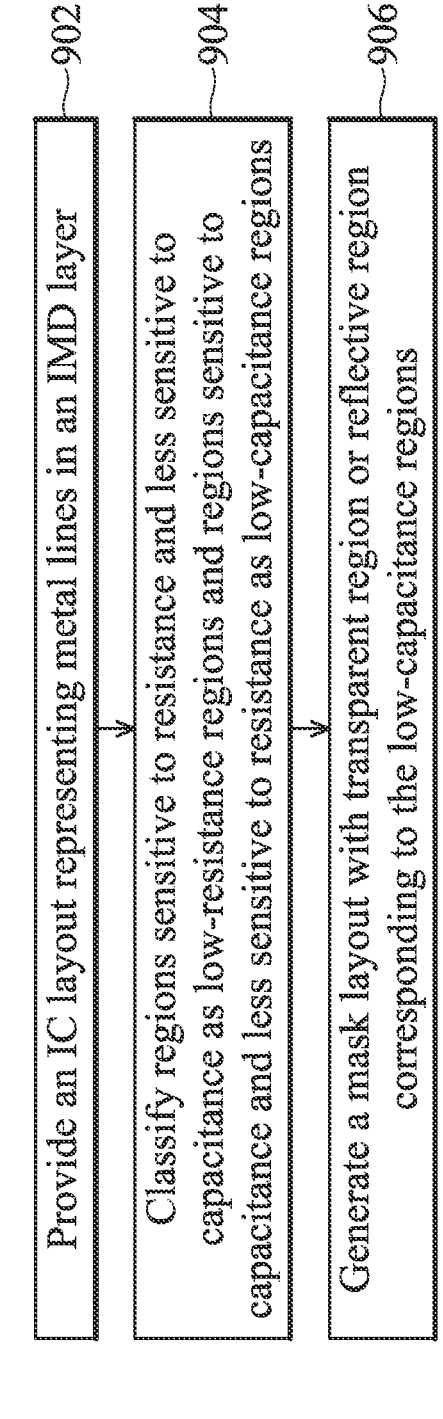

902 — Provide an IC layout representing metal lines in an IMD layer

904 — Classify regions sensitive to resistance and less sensitive to capacitance as low-resistance regions and regions sensitive to capacitance and less sensitive to resistance as low-capacitance regions 906 — Generate a mask layout with transparent region or reflective region corresponding to the low-capacitance regions

METAL LINES OF HYBRID HEIGHTS

PRIORITY DATA

This application claims priority to U.S. Provisional Patent Application No. 63/314,051 filed on Feb. 25, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As a part of the semiconductor fabrication, conductive elements are formed to provide electrical interconnections for the various components of an IC. For example, power grid (PG) patterns and track patterns are formed as metallization layers in providing power supply routing and signal routing for an IC. However, as semiconductor fabrication technology nodes continue to evolve, critical dimensions and pitches are becoming smaller and smaller. Accompanying the shrinking of line widths of PG patterns and track patterns, as well as distance between adjacent metallization layers, resistive-capacitive (RC) delay increases due to higher resistance and parasitic capacitance in the metallization layers, which may deteriorate circuit performance. Therefore, while processes for interconnect structure formation have generally been adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A and 6B illustrate a flow chart of a method for forming metal lines of hybrid heights, in accordance with some embodiments of the present disclosure.

FIGS. 7, 8, 9, 10, 11, 12, 13, 14, 15, 16, 17, 18, 19, 20, 21, 22, and 23 are cross-sectional views of a portion of a semiconductor device in various fabrication stages according to some embodiments of the method in FIGS. 6A and 6B.

FIG. 25 is a flow chart of a method of identifying regions sensitive to resistance and regions sensitive to capacitance in an IC layout and creating respective photomask for lithography process, in accordance with some embodiments of the present disclosure.

DETAILED DESCRIPTION

Figure 1:
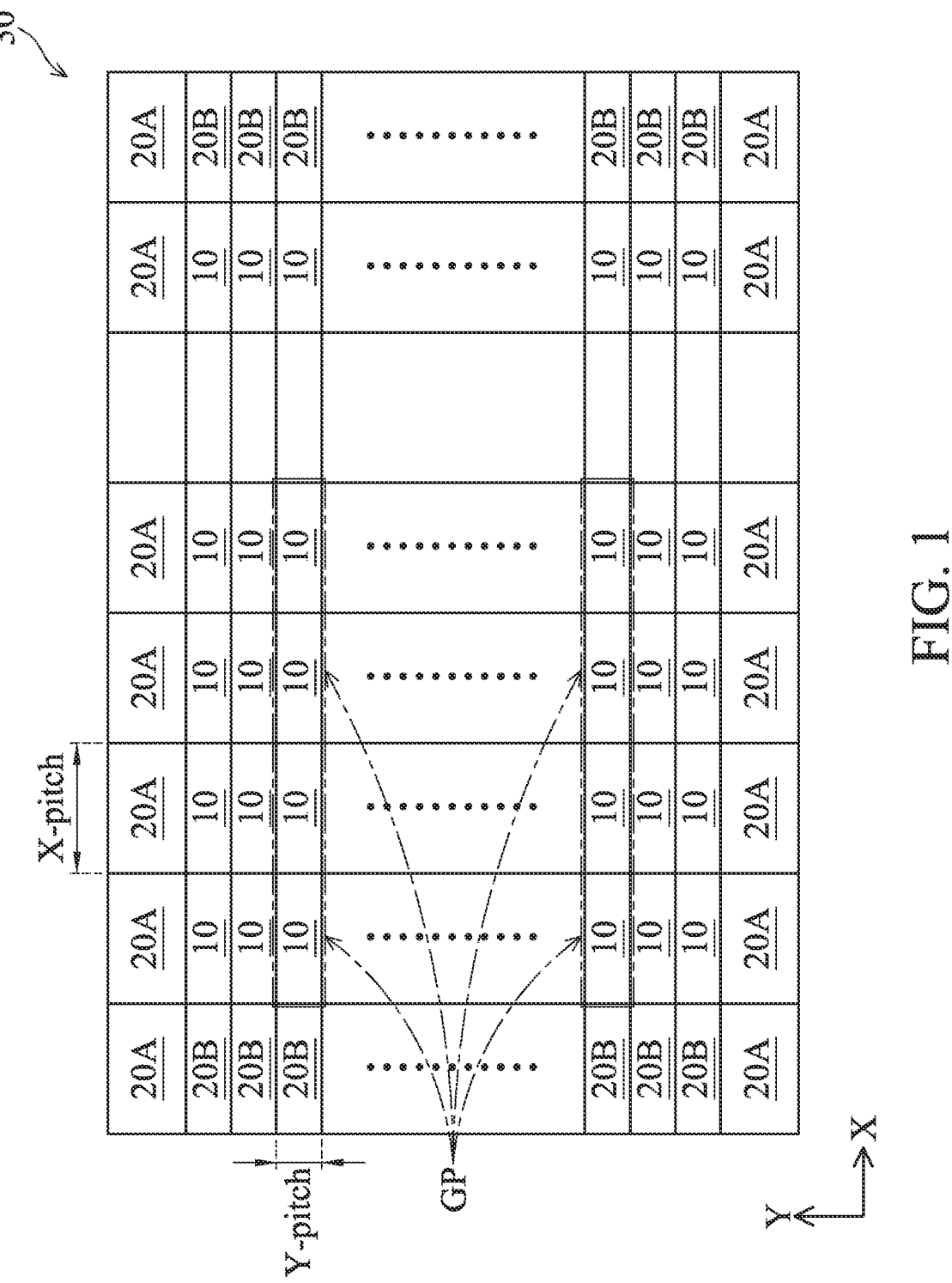
FIG. 1 shows a simplified diagram of a SRAM, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

An integrated circuit (IC) contains a plurality of metallization layers that includes patterned metal lines separated by inter-wiring spacings. Metal lines formed in trench-like openings typically extend substantially parallel to the semiconductor substrate. Semiconductor devices of such type, according to current technology, may comprise eight or more levels of metallization layers to satisfy device geometry and micro-miniaturization requirements. As a part of semiconductor fabrication, electrical interconnections need to be formed to electrically interconnect the various metallization layers, as well as other microelectronic elements (e.g., source/drain, gate, etc.), of a semiconductor device. Generally, this involves forming openings in layers (such as in electrically insulating layers), and subsequently filling these openings with an electrically conductive material. The electrically conductive material is then polished to form the electrical interconnections such as metal lines or vias.

However, as semiconductor technology generations continue the scaling-down process, resistance and parasitic capacitance in the metallization layers may become problematic for circuit performance due to the ever-decreasing critical dimensions. For example, increasing distance between adjacent metallization layers typically reduces parasitic capacitance therebetween. However, the increased distance in turn increases lengths for vias as interconnection between adjacent metallization layers. The increased via lengths introduce extra resistance to the metallization layers. On the other hand, reducing distance between adjacent metallization layers typically requires shorter vias, which reduces via resistance. However, the reduced distance between adjacent metallization layers in turn increases parasitic capacitance therebetween. Thus, it becomes difficult to lower resistance and parasitic capacitance at the same time.

The present disclosure is generally related to interconnect layers in integrated circuits, and more particularly to metal lines of hybrid heights in a metallization layer and method thereof in an effort to reduce resistive-capacitive (RC) delays. In embodiments of the present disclosure, the method identifies regions generally benefit from low resistance and less sensitive to capacitance (also referred to as low-resistance region) and regions generally benefit from low capacitance and less sensitive to resistance (also referred to as low-capacitance region) and forms metal lines with a larger height in low-resistance regions and metal lines with a lower height in low-capacitance regions. Examples for low-resistance region includes power grids (PG) for logic and memory circuits, in which high current flow generally requires low resistance metal routing to minimize voltage drops but insensitive to parasitic capacitance. Examples for low-capacitance region includes signal routing for logic and memory circuits, in which signal-integrity generally requires low parasitic capacitance to minimize propagation delay and signal interference but insensitive to resistance. The larger height of metal line reduces length needed for vias, which reduces resistance in interconnect structures. The lower height of metal line increases distance between adjacent metallization layers, which reduces parasitic capacitance. By independently tuning resistance and capacitance in low-resistance regions and low-capacitance regions, overall RC delays can be reduced for the circuit without sacrificing circuit performance. Furthermore, in embodiments of the present disclosure, the method allows forming air gaps between metal lines, resulting in an air-gap-containing interconnect structure, which provides reduced RC time constant for advanced semiconductor devices.

The various aspects of the present disclosure will now be discussed in more detail with reference to FIGS. 1-26. A static random access memory (SRAM) cell and the corresponding SRAM cell structure (e.g. a SRAM array) are provided in accordance with various exemplary embodiments. Some variations of some embodiments are discussed. Throughout the various views and illustrative embodiments, like reference numbers are used to designate like elements. SRAM is for illustrative purpose. Those skilled in the art should appreciate that they may readily use the present disclosure as a basis for designing or modifying other processes and structures for carrying out the same purposes and/or achieving the same advantages of the embodiments introduced herein, such as metallization layers in various integrated circuits other than SRAM.

SRAM is commonly used in integrated circuits. SRAM cells have the advantageous feature of being able to hold data without the need to refresh. With the increasingly demanding requirements on the speed of integrated circuits, the read speed and write speed of SRAM cells have also become more important. With the increasing down-scaling of the already very small SRAM cells, however, such requests are difficult to achieve. For example, the resistance of metallization layers, which form the word-lines, bit-lines, and power grids of SRAM cells, as well as parasitic capacitance between metal lines and metallization layers, becomes higher, and hence the RC delay of SRAM cells is increased, preventing substantial improvements in the read speed and write speed. Therefore, there is a need to provide a metal routing structure for the SRAM cells, so as to achieve better cell performance when the SRAM cells continue to shrink.

FIG. 1 shows a simplified diagram of an SRAM 30, in accordance with some embodiments of the present disclosure. The SRAM 30 can be an independent device or be implemented in an integrated circuit (e.g. System on Chip (SOC)). The SRAM 30 includes a cell array formed by multiple SRAM cells (or referred to as bit cells) 10, and the SRAM cells 10 are arranged in multiple rows and multiple columns in the cell array.

In the fabrication of SRAM cells, the cell array may be surrounded by multiple strap cells 20A and multiple edge cells 20B, and the strap cells 20A and the edge cells 20B are dummy cells for the cell array. In some embodiments, the strap cells 20A are arranged to surround the cell array horizontally, and the edge cells 20B are arranged to surround the cell array vertically. The shapes and sizes of the strap cells 20A and the edge cells 20B are determined according to actual application. In some embodiments, the shapes and sizes of the strap cells 20A and the edge cells 20B are the same as the SRAM cells 10. In some embodiments, the shapes and sizes of the strap cells 20A, the edge cells 20B, and the SRAM cells 10 are different.

In the SRAM 30, each SRAM cell 10 has the same rectangular shape/region with an X-pitch and a Y-pitch, and the Y-pitch is shorter than the X-pitch. In some embodiments, the ratio of the X-pitch to the Y-pitch is greater than 2 (i.e., X-pitch/Y-pitch>2). In the cell array of the SRAM 30, the SRAM cells 10 in the same row are divided into multiple groups GP, and each group GP includes two adjacent SRAM cells 10 and a metal routing structure on the two adjacent SRAM cells 10. The groups GP will be described in detail below.

Figure 2A:
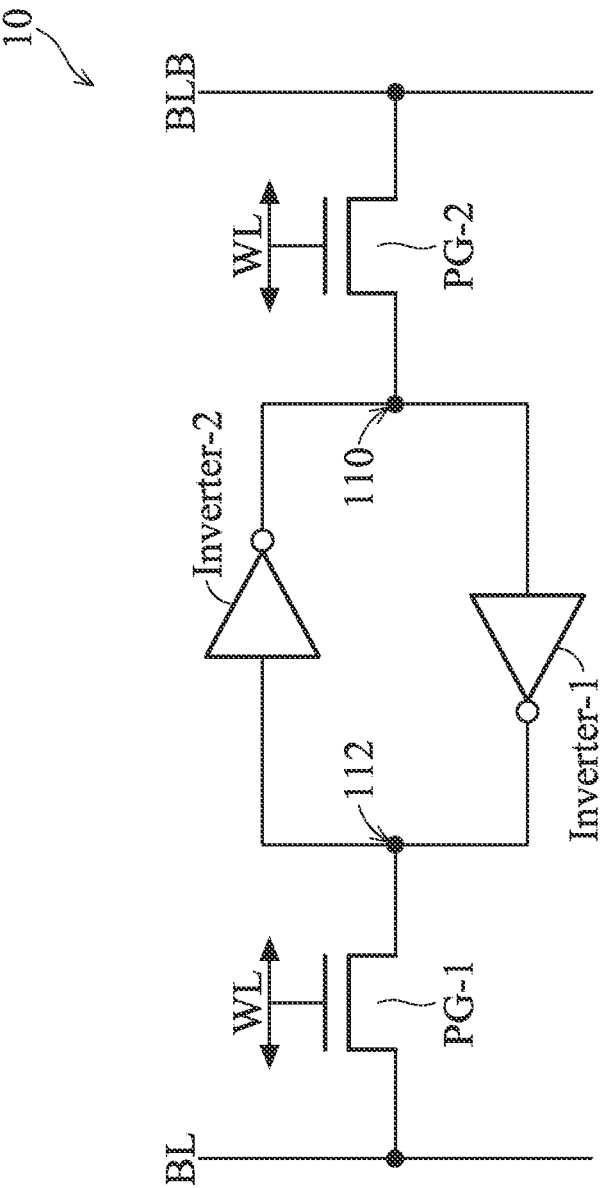
FIG. 2A shows a single-port SRAM cell, in accordance with some embodiments of the present disclosure.

FIG. 2A shows a single-port SRAM cell 10, in accordance with some embodiments of the present disclosure. The bit cell 10 includes a pair of cross-coupled inverters Inverter-1 and Inverter-2, and two pass-gate transistors PG-1 and PG-2. The inverters Inverter-1 and Inverter-2 are cross-coupled between the nodes 112 and 110, and form a latch. The pass-gate transistor PG-1 is coupled between a bit line (BL) and the node 112, and the pass-gate transistor PG-2 is coupled between a complementary bit line BLB and the node 110, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are n-channel metal-oxide semiconductor (NMOS) transistors.

Figure 2B:
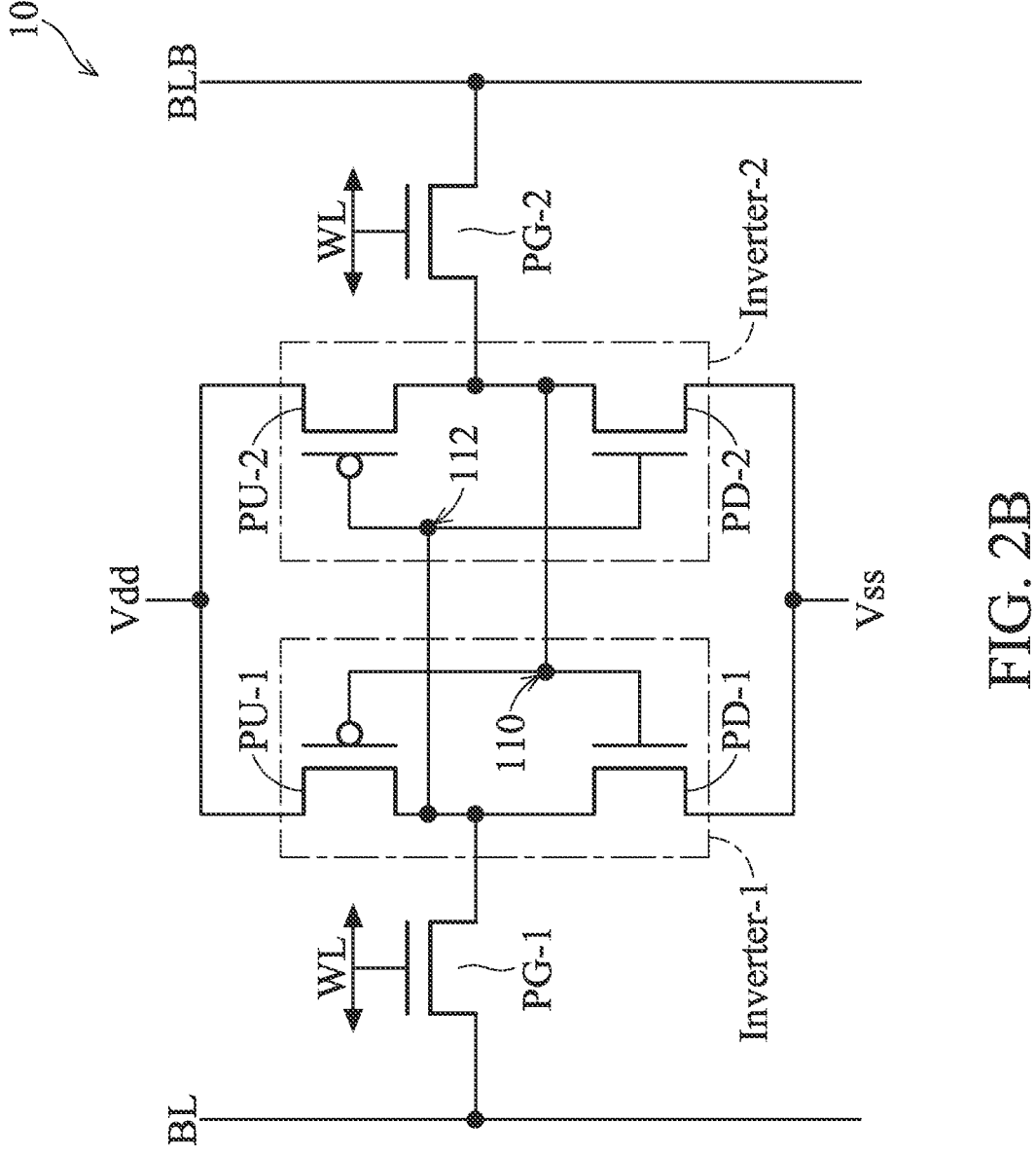
FIG. 2B shows a simplified diagram of the SRAM cell of FIG. 2A, in accordance with some embodiments of the present disclosure.

FIG. 2B shows a simplified diagram of the SRAM cell 10 of FIG. 2A, in accordance with some embodiments of the present disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the positive power supply node Vdd, and the source of the pull-down transistor PD-1 is coupled to a ground Vss. Similarly, the inverter Inverter-2 includes a pull-up transistor PU-2 and a pull-down transistor PD-2. The pull-up transistor PU-2 is a p-channel metal-oxide semiconductor (PMOS) transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the positive power supply node Vdd, and the source of the pull-down transistor PD-2 is coupled to the ground Vss.

Figure 3:
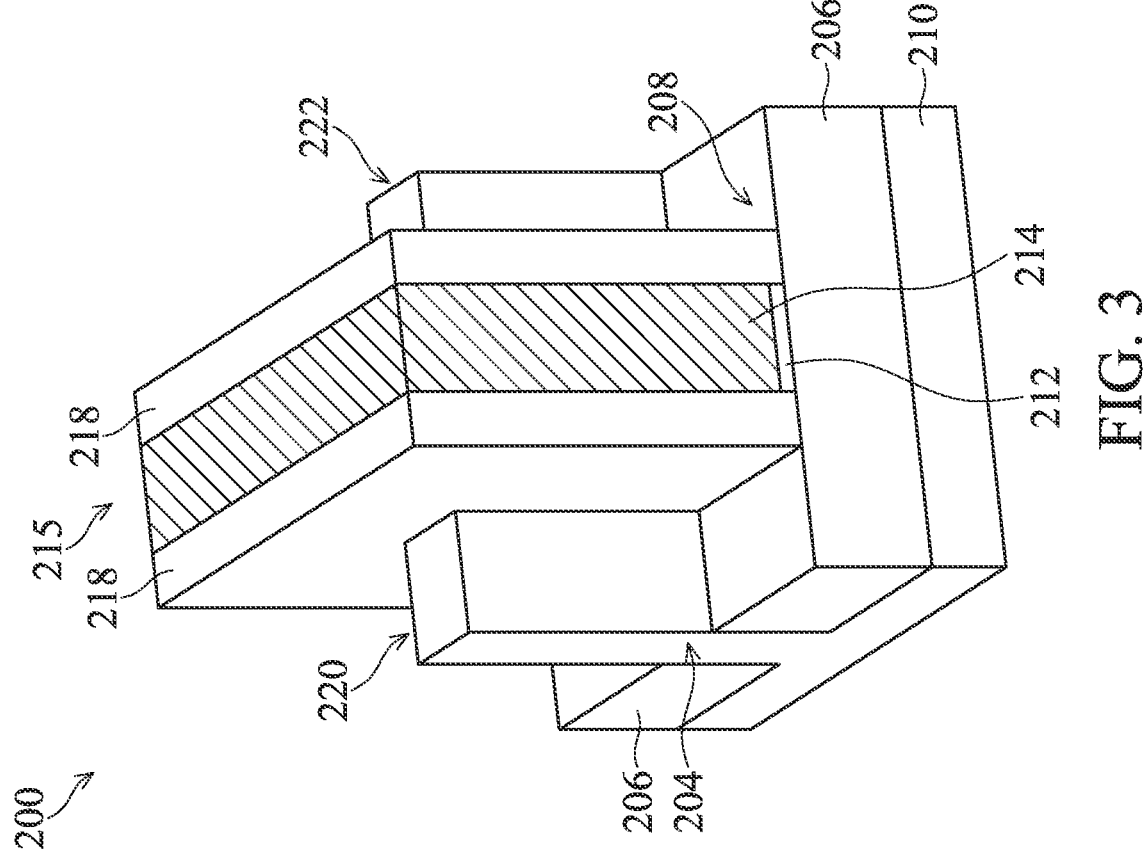
FIG. 3 illustrates a perspective view of a fin field effect transistor (FinFET), in accordance with some embodiments of the present disclosure.

FIG. 3 illustrates a perspective view of a fin field effect transistor (FinFET) 200, in accordance with some embodiments of the present disclosure. The FinFET 200 may serve as any of the transistors in the SRAM cell 10, including the pull-up transistors PU-1 and PU-2, the pull-down transistors PD-1 and PD-2, and the pass-gate transistors PG-1 and PG-2. In the illustrated embodiment, the FinFET 200 includes a semiconductor fin 204, a gate structure 215, the spacers 218, a drain region 220 and a source region 222. The semiconductor fin 204 extends above a semiconductor substrate 210. In some embodiments, the FinFET 200 includes multiple semiconductor fins 204. In some embodiments, the semiconductor substrate 210 and the semiconductor fin 204 are made of the same material. For example, the semiconductor substrate 210 is a silicon substrate. In some instances, the semiconductor substrate 210 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the semiconductor substrate 210 is a silicon on insulator (SOI) layer substrate or a silicon on sapphire (SOS) substrate. In some embodiments, the semiconductor substrate 210 and the semiconductor fin 204 are made of different materials.

In some embodiments, the semiconductor fin 204 of the FinFET 200 may be surrounded by an isolating features 206 formed on opposite sides of the semiconductor fin 204. The isolating features 206 may electrically isolate an active region (not shown) of the FinFET 200 from other active regions. In some embodiments, the isolating features 206 are shallow trench isolation (STI), field oxide (FOX), or another suitable electrically insulating structure.

In some embodiments, the gate structure 215, which includes a gate dielectric 212 and a gate electrode 214 formed over the gate dielectric 212, is positioned over sidewalls and a top surface of the semiconductor fin 204. Therefore, a portion of the semiconductor fin 204 overlaps the gate structure 215 may serve as a channel region of the FinFET 200. In some embodiments, the channel region of p-type FinFETs, for example, the pull-up transistors PU-1 and PU-2, includes a SiGe channel region. In some embodiments, the gate dielectric 212 is a high dielectric constant (high-k) dielectric material. In some embodiments, the gate electrode 214 is made of a conductive material, such as aluminum (Al), copper (Cu), tungsten (W), titanium (Ti), tantalum (Ta), or another applicable material.

In some embodiments, the spacers 218 of the FinFET 200 are positioned over sidewalls and a top surface of the semiconductor fin 204. In addition, the spacers 218 may be formed on opposite sides of the gate structure 215. In some embodiments, the spacers 218 are made of silicon nitride, silicon oxynitride, silicon carbide, another suitable material, or a combination thereof.

In some embodiments, portions of the semiconductor fin 204 that are not covered by the gate structure 215 and the spacers 218 serve as a drain region 220 and a source region 222. In some embodiments, the drain region 220 and the source region 222 of p-type FinFETs (e.g., the pull-up transistors PU-1 and PU-2) are formed by implanting the portions of the semiconductor fin 204 that are not covered by the gate structure 215 and the spacers 218 with a p-type impurity, such as boron, indium, or the like. In some embodiments, the drain region 220 and the source region 222 of n-type FinFETs (e.g., the pull-down transistors PD-1 and PD-2, and the pass-gate transistors PG-1 and PG-2) are formed by implanting the portions of the semiconductor fin 204 that are not covered by the gate structure 215 and the spacers 218 with an n-type impurity such as phosphorous, arsenic, antimony, or the like.

In some other embodiments, the pass-gate transistors PG-1 and PG-2, the pull-up transistors PU-1 and PU-2, and the pull-down transistors PD-1 and PD-2 of the SRAM cell 10 are gate-all-around (GAA) transistors, in which the gate structure 215 wraps around each of a stack of channel layers. In some other embodiments, the pass-gate transistors PG-1 and PG-2, the pull-up transistors PU-1 and PU-2, and the pull-down transistors PD-1 and PD-2 of the SRAM cell 10 are planar MOS transistors.

Figure 4:
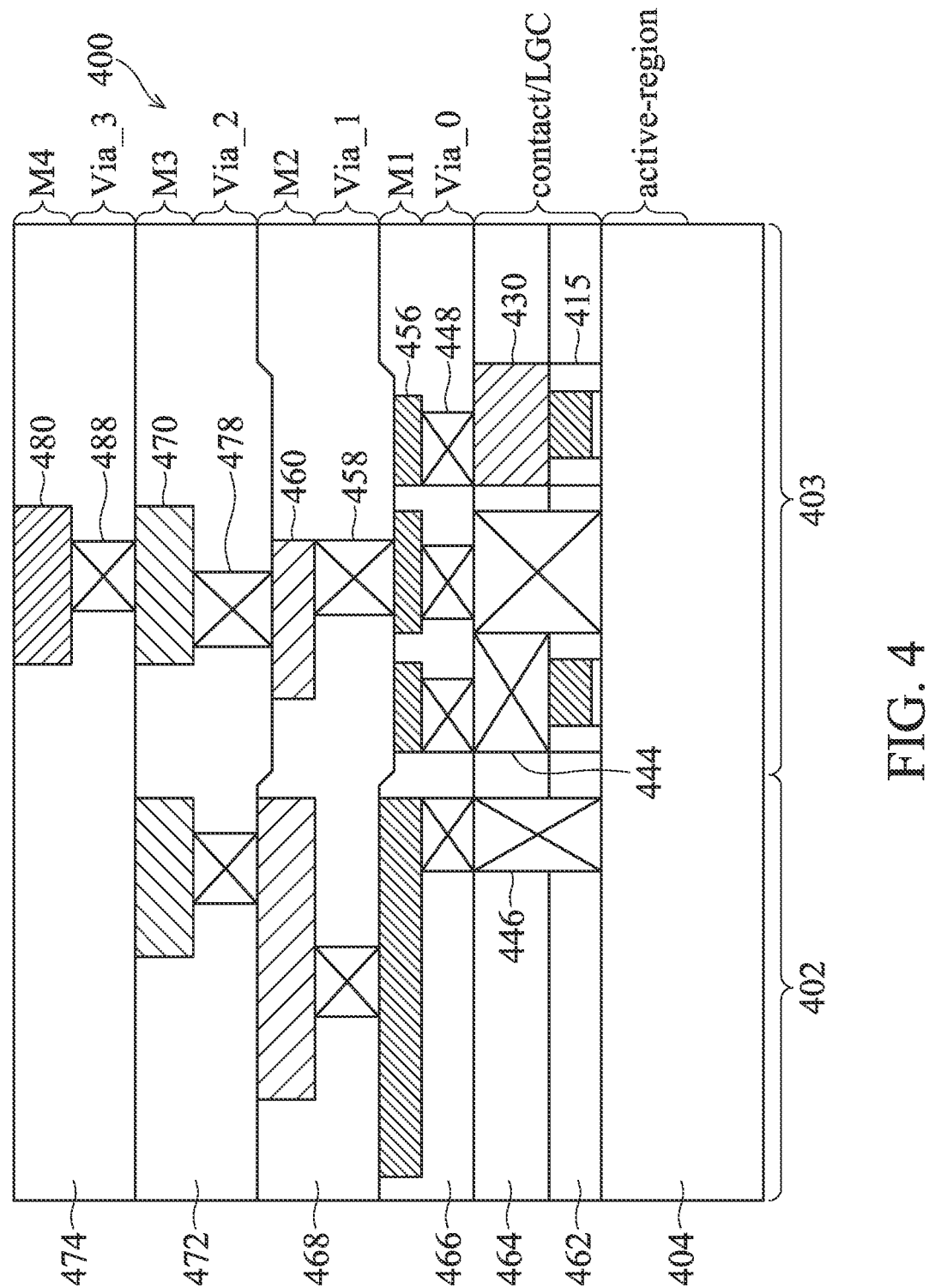
FIG. 4 shows a schematic cross-sectional view of multiple layers involved in the SRAM cell with metal lines of hybrid heights, in accordance with some embodiments of the present disclosure.

FIG. 4 shows a schematic cross-sectional view of multiple layers involved in the SRAM cell 10, in accordance with some embodiments of the present disclosure. The layers of FIG. 4 are formed on a semiconductor chip or a wafer. Furthermore, FIG. 4 is schematically illustrated to show various levels of an interconnect structure 400 and transistors, and may not reflect the actual cross-sectional view of SRAM cell 10. The interconnect structure 400 may include an active-region level (labeled as "active-region" in FIG. 4), a contact/LGC (local gate connection) level (labeled as "contact/LGC" in FIG. 4), multiple via levels (labeled as "Via_0", "Via_1", "Via_2", and "Via-3" in FIG. 4), and multiple metal-layer levels (labeled as "M1", "M2", "M3", and "M4" in FIG. 4). Each of the levels and layers includes one or more dielectric layers and the conductive features formed therein.

In some embodiments, the active-region level may include a semiconductor fin 404 (or a semiconductor substrate) formed therein. The contact/LGC (local gate connection) level may include transistors 415, contacts 446, gate contacts 444 and conductive line patterns 430 formed in dielectric layers 462 and 464. In addition, the dielectric layers 462 and 464 may serve as inter-layer dielectric (ILD) layers. The Via_0 level may include vias 448, and the M1 level may include conductive features 456 (e.g. metal lines). In addition, the vias 448 and the conductive features 456 are formed in a dielectric layer 466. The Via_1 level may include vias 458, and the M2 level may include conductive features 460 (e.g. metal lines). In addition, the vias 458 and the conductive features 460 are formed in a dielectric layer 468. The Via_2 level may include vias 478, and the M3 level may include conductive features 470 (e.g. metal lines). In addition, the vias 478 and the conductive features 470 are formed in a dielectric layer 472. The Via_3 level may include vias 488, and the M4 level may include conductive features 480 (e.g. metal lines). In addition, the vias 488 and the conductive features 480 are formed in a dielectric layer 474. The dielectric layers 466, 468, 472 and 474 may serve as inter-metal dielectric (IMD) layer. Furthermore, the thickness of conductive features 460, 470 and 480 is thicker than that of conductive features 456.

In some embodiments, the contact/LGC (local gate connection) level includes the contacts 446, the gate contacts 444 and the conductive line patterns 430. The gate contacts 444 and the conductive line patterns 430 at the contact/LGC (local gate connection) level may be designed to connect the gate electrode patterns of transistors 415 to an overlying level such as the Via_0 level. In addition, the conductive line patterns 430 at the contact/LGC (local gate connection) level may be designed to connect the gate electrodes of different transistors. The contacts 446 at the contact/LGC (local gate connection) level connects the source regions and drain regions of transistors 415, pickup regions of well regions at the active-region level, and the like to an overlying level such as the Via_0 level.

Still referring to FIG. 4, the conductive features that are at the same level may be formed simultaneously. Generally, the conductive features that are at the same level may have top surfaces that are substantially level with each other and bottom surfaces that are substantially level with each other. As a comparison, as depicted in FIG. 4, the conductive features (e.g., metal lines) that are at the same level may have bottom surfaces that are substantially level with each other, but have different heights (also referred to as hybrid heights) in different regions, such as in one or more low-resistance regions 402 and one or more low-capacitance regions 403. Taking M1 level as an example, the conductive features 456 in the region 402 may have a top surface above those in the region 403. In other words, the conductive features 456 in the region 403 may have recessed top surfaces below those in the region 402. Due to the hybrid heights, vias 458 in the region 402 have a shorter length than those in the regions 403, which introduces less resistance. Meanwhile, vertical distance between the conductive feature 460 and the conductive features 456 in the region 403 is enlarged, which reduces parasitic capacitance between M1 level and M2 level. Similarly, the conductive features 460 in the region 402 may have a top surface above those in the region 403. Consequently, resistance in the low-resistance region 402 is reduced, and capacitance in the low-capacitance region 403 is reduced simultaneously. Since the low-resistance region 402 is less sensitive to capacitance and the low-capacitance region 403 is less sensitive to resistance, the overall RC delay performance of the SRAM cells is improved. Further, not all the conductive features in different metal levels are required to have hybrid heights. For example, the conductive features 470 in M3 level or the conductive features 480 in M4 level may have level top surfaces and bottom surfaces, as RC delay is dominantly determined by lower metallization layers. By limiting metal lines of hybrid heights in non-top metallization layers, production complexity and costs may be better controlled. Nonetheless, in some embodiments, metal lines in top metallization layers may also have hybrid heights, such as when the device is performance driven.

Figure 5A:
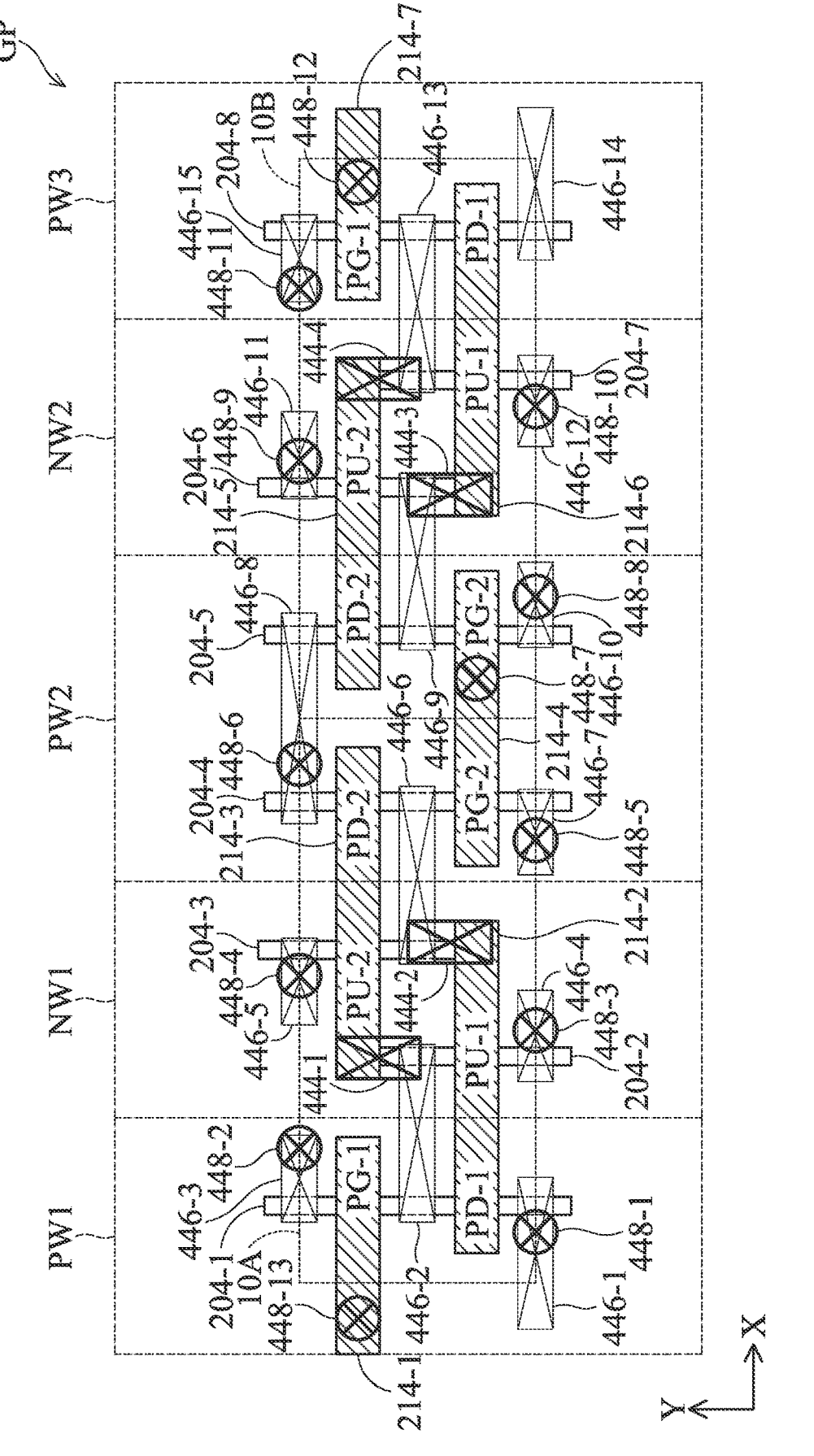
FIGS. 5A, 5B, and 5C show top and cross-sectional views of a layout illustrating a group of an SRAM structure, in accordance with some embodiments of the present disclosure.
Figure 5B:
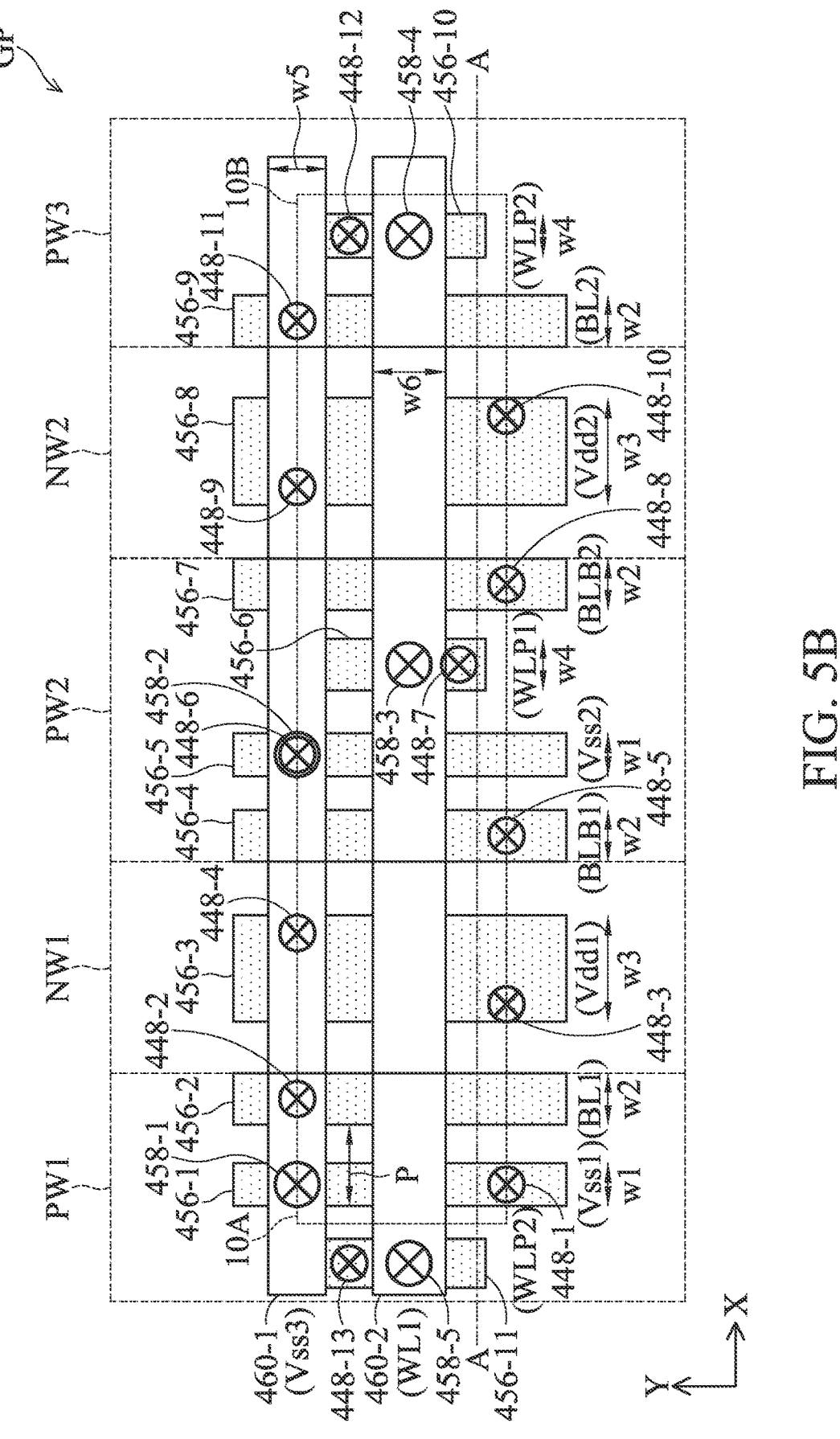
Figure 5C:
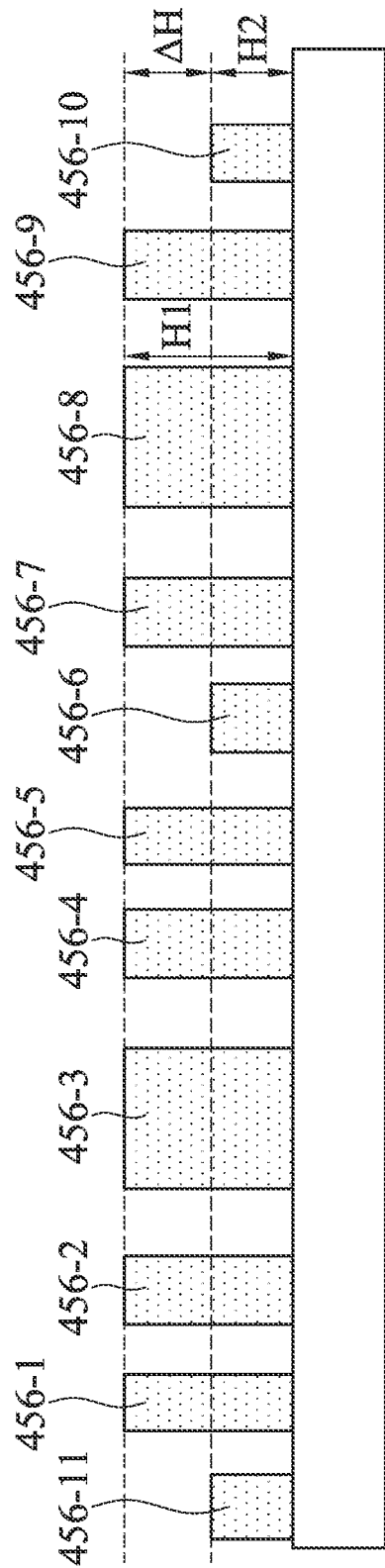

FIG. 5A and FIG. 5B show a layout illustrating a SRAM structure of a group GP of the SRAM 30, in accordance with some embodiments of the present disclosure. The group GP includes two adjacent SRAM cells 10A and 10B arranged in the same row of the cell array of the SRAM 30 and a metal routing structure on the two adjacent SRAM cells 10A and 10B. FIG. 5C shows a cross-sectional view of metal lines in the metal routing structure of the group GP along A-A line in FIG. 5B. The metal routing structure and the formation thereof will be described in detail below.

In some embodiments, the two adjacent SRAM cells 10A and 10B are arranged in mirror symmetry. As described in FIG. 1, an outer boundary of each of the SRAM cells 10A and 10B is illustrated using dashed lines, which mark a rectangular region with an X-pitch and a Y-pitch, and the Y-pitch is shorter than the X-pitch. In some embodiments, the ratio of the X-pitch to the Y-pitch is greater than 2 (X-pitch/Y-pitch>2).

FIG. 5A shows a plan view of an interconnect structure used as the routings of the SRAM cells 10A and 10B of the group GP, and the interconnect structure is formed by an arrangement of multiple lower layers (or levels) including wells, fins 204, electrodes 214 (e.g., gate electrode 214 of FIG. 3), contacts 446 and gate contacts 444 of the contact/ LGC (local gate connection) level, and vias 448 at the Via_0 level overlying the contact/LGC (local gate connection) level. It should be noted that various levels of the interconnect structure shown in FIG. 5A is merely an example and is not intended to limit the SRAM cells 10A and 10B of the group GP.

In the SRAM cell 10A of FIG. 5A, the semiconductor fin 204-1 is configured to serve as the channel regions of the pass-gate transistor PG-1 and the pull-down transistor PD-1. Furthermore, the pass-gate transistor PG-1 and the pull-down transistor PD-1 are formed in a first P-type well region PW1 of a substrate. For the pass-gate transistor PG-1, an electrode 214-1 is configured to electrically connect a gate region of the pass-gate transistor PG-1, and the contacts 446-2 and 446-3 are configured to electrically connect the drain and source regions of the pass-gate transistor PG-1, respectively. For the pull-down transistor PD-1, an electrode 214-2 is configured to electrically connect a gate region of the pull-down transistor PD-1, and the contacts 446-2 and 446-1 are configured to electrically connect the drain and source regions of the pull-down transistor PD-1, respectively.

In the SRAM cell 10A of FIG. 5A, the semiconductor fin 204-2 is configured to serve as the channel region of the pull-up transistor PU-1. Furthermore, the pull-up transistor PU-1 is formed in a first N-type well region NW1 of the substrate. For the pull-up transistor PU-1, the electrode 214-2 is configured to electrically connect a gate region of the pull-up transistor PU-1, and the contact 446-2 and 446-4 are configured to electrically connect the drain and source regions of the pull-up transistor PU-1, respectively. As described above, the electrode 214-2 is also electrically coupled to the gate region of the pull-down transistor PD-1, and the contact 446-2 is also electrically coupled to the drain regions of the pull-down transistor PD-1 and the pass-gate transistor PG-1.

In the SRAM cell 10A of FIG. 5A, the semiconductor fin 204-3 is configured to serve as the channel region of the pull-up transistor PU-2. Furthermore, the pull-up transistor PU-2 is formed in the first N-type well region NW1 of the substrate. For the pull-up transistor PU-2, the electrode 214-3 is configured to electrically connect a gate region of the pull-up transistor PU-2, and the contact 446-6 and 446-5 are configured to electrically connect the drain and source regions of the pull-up transistor PU-2, respectively. Furthermore, the electrode 214-3 is configured to electrically connect the contact 446-2 through a gate contact 444-1, thus the gate region of the pull-up transistor PU-2 is electrically coupled to the drain regions of the pull-up transistor PU-1, the pull-down transistor PD-1, and the pass-gate transistor PG-1.

In the SRAM cell 10A of FIG. 5A, the semiconductor fin 204-4 is configured to serve as the channel regions of the pass-gate transistor PG-2 and the pull-down transistor PD-2. Furthermore, the pass-gate transistor PG-2 and the pull-down transistor PD-2 are formed in a second P-type well region PW2 of the substrate. In some embodiments, the first N-type well region NW1 is positioned between the first P-type well region PW1 and the second P-type well region PW2. For the pass-gate transistor PG-2, an electrode 214-4 is configured to electrically connect a gate region of the pass-gate transistor PG-2, and the contacts 446-6 and 446-7 are configured to electrically connect the drain and source regions of the pass-gate transistor PG-2, respectively. For the pull-down transistor PD-2, the electrode 214-3 is configured to electrically connect a gate region of the pull-down transistor PD-2, and the contacts 446-6 and 446-8 are configured to electrically connect the drain and source regions of the pull-down transistor PD-2, respectively. As described above, the electrode 214-3 is also electrically coupled to the gate region of the pull-up transistor PU-2, thus the gate region of the pull-down transistor PD-2 is also electrically coupled to the drain regions of the pull-up transistor PU-1, the pull-down transistor PD-1, and the pass-gate transistor PG-1. Moreover, the contact 446-6 is electrically coupled to the drain region of the pull-up transistor PU-2 and to the electrode 214-2 through the gate contact 444-2, thus the drain regions of the pull-down transistor PD-2 and the pass-gate transistor PG-2 are also electrically coupled to the drain region of the pull-up transistor PU-2, and the gate regions of the pull-up transistor PU-1 and the pull-down transistor PD-1.

In the SRAM cell 10A, the first N-type well region NW1 is arranged at the middle of the SRAM cell 10A, and the first and second P-type well regions PW1 and PW2 are arranged on opposite sides of the first N-type well region NW1.

In the SRAM cell 10B of FIG. 5A, the semiconductor fin 204-8 is configured to serve as the channel regions of the pass-gate transistor PG-1 and the pull-down transistor PD-1. Furthermore, the pass-gate transistor PG-1 and the pull-down transistor PD-1 are formed in a third P-type well region PW3 of the substrate. For the pass-gate transistor PG-1, an electrode 214-7 is configured to electrically connect a gate region of the pass-gate transistor PG-1, and the contacts 446-13 and 446-15 are configured to electrically connect the drain and source regions of the pass-gate transistor PG-1, respectively. For the pull-down transistor PD-1, an electrode 214-6 is configured to electrically connect a gate region of the pull-down transistor PD-1, and the contacts 446-13 and 446-14 are configured to electrically connect the drain and source regions of the pull-down transistor PD-1, respectively.

In the SRAM cell 10B of FIG. 5A, the semiconductor fin 204-7 is configured to serve as the channel region of the pull-up transistor PU-1. Furthermore, the pull-up transistor PU-1 is formed in a second N-type well region NW2 of the substrate. For the pull-up transistor PU-1, the electrode 214-6 is configured to electrically connect a gate region of the pull-up transistor PU-1, and the contact 446-13 and 446-12 are configured to electrically connect the drain and source regions of the pull-up transistor PU-1, respectively. As described above, the electrode 214-6 is also electrically coupled to the gate region of the pull-down transistor PD-1, and the contact 446-13 is also electrically coupled to the drain regions of the pull-down transistor PD-1 and the pass-gate transistor PG-1.

In the SRAM cell 10B of FIG. 5A, the semiconductor fin 204-6 is configured to serve as the channel region of the pull-up transistor PU-2. Furthermore, the pull-up transistor PU-2 is formed in the second N-type well region NW2 of the substrate. For the pull-up transistor PU-2, the electrode 214-5 is configured to electrically connect a gate region of the pull-up transistor PU-2, and the contact 446-9 and 446-11 are configured to electrically connect the drain and source regions of the pull-up transistor PU-2, respectively. Furthermore, the electrode 214-5 is configured to electrically connect the contact 446-13 through a gate contact 444-4, thus the gate region of the pull-up transistor PU-2 is electrically coupled to the drain regions of the pull-up transistor PU-1, the pull-down transistor PD-1, and the pass-gate transistor PG-1.

In the SRAM cell 10B of FIG. 5A, the semiconductor fin 204-5 is configured to serve as the channel regions of the pass-gate transistor PG-2 and the pull-down transistor PD-2. Furthermore, the pass-gate transistor PG-2 and the pull-down transistor PD-2 are formed in the second P-type well region PW2 of the substrate. In some embodiments, the second N-type well region NW2 is positioned between the second P-type well region PW2 and the third P-type well region PW3. For the pass-gate transistor PG-2, the electrode 214-4 is configured to electrically connect a gate region of the pass-gate transistor PG-2, and the contacts 446-9 and 446-10 are configured to electrically connect the drain and source regions of the pass-gate transistor PG-2, respectively. For the pull-down transistor PD-2, the electrode 214-5 is configured to electrically connect a gate region of the pull-down transistor PD-2, and the contacts 446-9 and 446-8 are configured to electrically connect the drain and source regions of the pull-down transistor PD-2, respectively. As described above, the electrode 214-5 is also electrically coupled to the gate region of the pull-up transistor PU-2, thus the gate region of the pull-down transistor PD-2 is also electrically coupled to the drain regions of the pull-up transistor PU-1, the pull-down transistor PD-1, and the pass-gate transistor PG-1. Moreover, the contact 446-9 is electrically coupled to the drain region of the pull-up transistor PU-2 and to the electrode 214-6 through the gate contact 444-3, thus the drain regions of the pull-down transistor PD-2 and the pass-gate transistor PG-2 are also electrically coupled to the drain region of the pull-up transistor PU-2, and the gate regions of the pull-up transistor PU-1 and the pull-down transistor PD-1.

In the group GP of FIG. 5A, the source regions of the pull-down transistors PD-2 of the SRAM cells 10A and 10B are coupled together through the contact 446-8. Furthermore, the gate regions of the pass-gate transistors PG-2 of the SRAM cells 10A and 10B are coupled together through the electrode 214-4.

In the SRAM cell 10B, the second N-type well region NW2 is arranged at the middle of the SRAM cell 10B, and the second and third P-type well regions PW2 and PW3 are arranged on opposite sides of the second N-type well region NW2. Furthermore, the second P-type well region PW2 is shared by the SRAM cells 10A and 10B.

FIG. 5B shows a plan view of an interconnect structure used as the routings of the SRAM cells 10A and 10B of the group GP, and the interconnect structure is formed by an arrangement of multiple higher layers (or levels) including vias 448 at the Via_0 level overlying the contact/LGC (local gate connection) level, conductive features (metal lines) 456 in the M1 level overlying the Via_0 level, vias 458 at the Via_1 level overlying the M1 level, and conductive features (metal lines) 460 in the M2 level overlying the Via_1 level. In the group GP of FIG. 5B, the conductive features (metal lines) 456-1 to 456-11 are formed in a first metallization layer (e.g. the M1 level), and extend parallel to a Y-direction. In some embodiments, a minimum pitch (denoted as P) of the metal lines 456-1 to 456-11 may range from about 12 nanometer (nm) to about 25 nm. It should be noted that various levels of the interconnect structure shown in FIG. 5B is merely an example and is not intended to be limiting the actual cross-sectional view of SRAM cells 10A and 10B of the group GP.

Referring to FIGS. 5A and 5B together, the metal line 456-1 is configured to serve as a first Vss line Vss1. The first Vss line VSS1 is electrically coupled to the source region of the pull-down transistor PD-1 of the SRAM cell 10A through the via 448-1 and the contact 446-1. The width of the first Vss line Vss1 is w1.

The metal line 456-2 is positioned between the metal lines 456-1 and 456-3. The metal line 456-2 is configured to serve as a first bit line BL1. The first bit line BL1 is electrically coupled to the source region of the pass-gate transistor PG-1 of the SRAM cell 10A through the via 448-2 and the contact 446-3. The width of the first bit line BL1 is w2, and the first bit line BL1 is wider than the first Vss line Vss1, e.g., w2>w1. In some embodiments, the first bit line BL1 has wider width (>10%) than the first Vss line Vss1.

The metal line 456-3 is positioned between the metal lines 456-2 and 456-4. The metal line 456-3 is configured to serve as a first power supply line Vdd1. The first power supply line Vdd1 is electrically coupled to the source region of the pull-up transistor PU-1 of the SRAM cell 10A through the via 448-3 and the contact 446-4. Furthermore, the first power supply line Vdd1 is also electrically coupled to the source region of the pull-up transistor PU-2 of the SRAM cell 10A through the via 448-4 and the contact 446-5. The width of the first power supply line Vdd1 is w3, and the first power supply line Vdd1 is wider than the first bit line BL1, e.g., w3>w2. In some embodiments, the first power supply line Vdd1 has wider width (>10%) than the first bit line BL1.

The metal line 456-4 is positioned between the metal lines 456-3 and 456-5. The metal line 456-4 is configured to serve as a first complementary bit line BLB1. The first complementary bit line BLB1 is electrically coupled to the source region of the pass-gate transistor PG-2 of the SRAM cell 10A through the via 448-5 and the contact 446-7. The width of the first complementary bit line BLB1 is w2.

The metal line 456-6 is positioned between the metal lines 456-5 and 456-7. The metal line 456-6 is configured to serve as a first word-line landing pad WLP1. The first word-line landing pad WLP1 is electrically coupled to the gate region of the pass-gate transistor PG-2 of the SRAM cell 10A through the via 448-7. The width of the first word-line landing pad WLP1 is w4. In some embodiments, the widths of the first word-line landing pad WLP1 and the first bit line BL1 are the same, e.g., w4=w2. As described above, the gate regions of the pass-gate transistor PG-2 of the SRAM cell 10A and the pass-gate transistor PG-2 of the SRAM cell 10B are coupled together through the electrode 214-4. Thus, the first word-line landing pad WLP1 is also electrically coupled to the gate region of the pass-gate transistor PG-2 of the SRAM cell 10B through the via 448-7. Furthermore, the first word-line landing pad WLP1 is positioned within the SRAM cell 10B without touching or overlaying the cell boundary of the SRAM cell 10B, i.e., the first word-line landing pad WLP1 does not exceed the SRAM cell 10B.

The metal line 456-7 is positioned between the metal lines 456-6 and 456-8. The metal line 456-7 is configured to serve as a second complementary bit line BLB2. The second complementary bit line BLB2 is electrically coupled to the source region of the pass-gate transistor PG-2 of the SRAM cell 10B through the via 448-8 and the contact 446-10. The width of the second bit complementary line BLB2 is w2. In some embodiments, the widths of the first and second bit complementary lines BLB1 and BLB2 are different.

The metal line 456-8 is positioned between the metal lines 456-7 and 456-9. The metal line 456-8 is configured to serve as a second power supply line Vdd2. The second power supply line Vdd2 is electrically coupled to the source region of the pull-up transistor PU-1 of the SRAM cell 10B through the via 448-10 and the contact 446-12. Furthermore, the second power supply line Vdd2 is also electrically coupled to the source region of the pull-up transistor PU-2 of the SRAM cell 10B through the via 448-9 and the contact 446-11. The width of the second power supply line Vdd2 is w3. In some embodiments, the widths of the first and second power supply lines Vdd1 and Vdd2 are different.

The metal line 456-9 is positioned between the metal lines 456-8 and 456-10. The metal line 456-9 is configured to serve as a second bit line BL2. The second bit line BL2 is electrically coupled to the source region of the pass-gate transistor PG-1 of the SRAM cell 10B through the via 448-11 and the contact 446-15. The width of the second bit line BL2 is w2. In some embodiments, the widths of the first and second bit lines BL1 and BL2 are different.

The metal line 456-10 is configured to serve as a second word-line landing pad WLP2. The second word-line landing pad WLP2 is electrically coupled to the gate region of the pass-gate transistor PG-2 of the SRAM cell 10B through the via 448-12. The width of the second word-line landing pad WLP2 is w4. In some embodiments, the widths of the first and second word-line landing pads WLP1 and WLP2 are different. Furthermore, the second word-line landing pad WLP2 is also positioned within the SRAM cell 10B without touching or overlaying the cell boundary of the SRAM cell 10B, i.e., the second word-line landing pad WLP2 does not exceed the SRAM cell 10B.

The metal lines 460-1 and 460-2 are formed in a second metallization layer (e.g. the M2 level), and extend parallel to an X-direction, and the X-direction is perpendicular to the Y-direction. Furthermore, thickness of the metal lines 460-1 and 460-2 is thicker than that of the metal lines 456-1 to 456-10.

The metal line 460-1 is configured to serve as a third Vss line Vss3. The third Vss line Vss3 is electrically coupled to the first Vss line Vss1 through the via 458-1 and to the second Vss line Vss2 through the via 458-2. The width of the third Vss line Vss3 is w5.

The metal line 460-2 is configured to serve as a first word line WL1. The first word line WL1 is electrically coupled to the first word-line landing pad WLP1 through the via 458-3 and to the second word-line landing pad WLP2 through the via 458-4. The width of the first word line WL1 is w6, and the first word line WL1 is wider than the third Vss line Vss3, e.g., w6>w5.

In some embodiments, the layouts of the groups GP in the same row of the SRAM 30 are the same. For example, the group GP, a left group (not shown) on the left side of the group GP and a right group (not shown) on the right side of the group GP all have the same structure in layout. Specifically, the arrangement of multiple layers of the SRAM cells 10A and 10B of the group GP, the left group, and the right group are the same. Thus, the first word line WL1 is also electrically coupled to the second word-line landing pad WLP2 of the SRAM cell 10B of the left group through the via 458-5, thus the first word line WL1 is electrically coupled to the electrode 214-1 through the via 458-5, the second word-line landing pad WLP2, and the via 448-13 positioned in the SRAM cell 10B of the left group. Similarly, the first word line WL1 is electrically coupled to the electrode 214-7 through the via 458-4, the second word-line landing pad WLP2, and the via 448-12 positioned in the SRAM cell 10B of the group GP, and the electrode 214-7 is coupled to the pass-gate transistor PG-1 (not shown) of the SRAM 10A of the right group. In the group GP, the source region of the pull-down transistor PD-1 of the SRAM cell 10B is electrically coupled to the first Vss line Vss1 (not shown) of the right group through the contact 446-14.

FIG. 5C shows a cross-sectional view of metal lines 456-1 to 456-11 in the metal routing structure of the group GP along A-A line in FIG. 5B. An optimal automatic-place-and-route (APR) tool may be used to determine critical paths that concern resistance more than capacitance, which would be assigned as low-resistance region, in which a higher metal line is needed to reduce resistance, and vice versa for low-capacitance region. Metal lines in low-resistance region have a first height H1, and metal lines in low-capacitance region have a second height H2 that is lower than the first height H1. In some embodiments, the first height H1 ranges from about 12 nm to about 30 nm, and the second height H2 ranges from about 5 nm to 27 nm. In various embodiments, the metal height difference ΔH (H1-H2) is at least larger than about 3 nm. When the metal height difference is less than 3 nm, the capacitance cannot be reduced sufficiently.

In the depicted embodiment, metal lines 456-1 and 456-5 serving as Vss lines and metal lines 456-3 and 456-8 serving as Vdd lines are determined as critical paths that concern resistance but insensitive to capacitance. Other tracks in SRAM cells may be determined as critical paths that concern capacitance but insensitive to resistance. In addition, metal lines 456-2, 456-4, 456-7, 456-9 serving as bit lines may also be determined as critical paths that concern resistance but insensitive to capacitance, while metal lines 456-6, 456-10, and 456-11 serving as signal lines other than bit lines may be determined as critical paths that concern capacitance but insensitive to resistance. By having the larger height H1 for metal lines in M1 level, vias (e.g., vias 458-1 and 458-2) connecting metal lines 456-1 to 456-5 and 456-7 to 456-9 to M2 level (e.g., metal line 460-1) are shorter with less resistance. The voltage drop on the power grids is reduced. Meanwhile, by having the recessed height H2 for metal lines in M1 level, vias (e.g., vias 458-3, 458-4, and 458-5) connecting metal lines 456-6, 456-10, and 456-11 to M2 level (e.g., metal line 460-2) are longer, which translates to a larger distance between metal lines in M1 level and M2 level and thus less parasitic capacitance. The overall RC delay performance is improved by reducing resistance in critical paths for resistance and reducing capacitance in critical paths for capacitance, respectively.

FIGS. 6A and 6B illustrate a flow chart of a method 600, constructed according to various aspects of the present disclosure. The method 600 is an example and is not intended to limit the present disclosure beyond what is explicitly recited in the claims. Additional operations can be provided before, during, and after the method 600, and some operations described can be replaced, eliminated, or relocated for additional embodiments of the method. The method 600 is described below in conjunction with FIGS. 7-23, which graphically illustrate some principles of the method 600. FIGS. 7-23 illustrate cross-sectional views of an exemplary integrated circuit 700 during various fabrication stages of the method 600 in accordance with some embodiments. In the illustrated embodiment, metallization layers for SRAM cells, such as metallization layers from M1-M4 levels as illustrated in FIG. 4, are formed, which is for illustrative purpose. Those skilled in the art should appreciate that they may readily use the present disclosure as a basis for designing or modifying other processes and structures for carrying out the same purposes and/or achieving the same advantages of the embodiments introduced herein, such as metallization layers in various integrated circuits other than SRAM cells.

Figure 7:
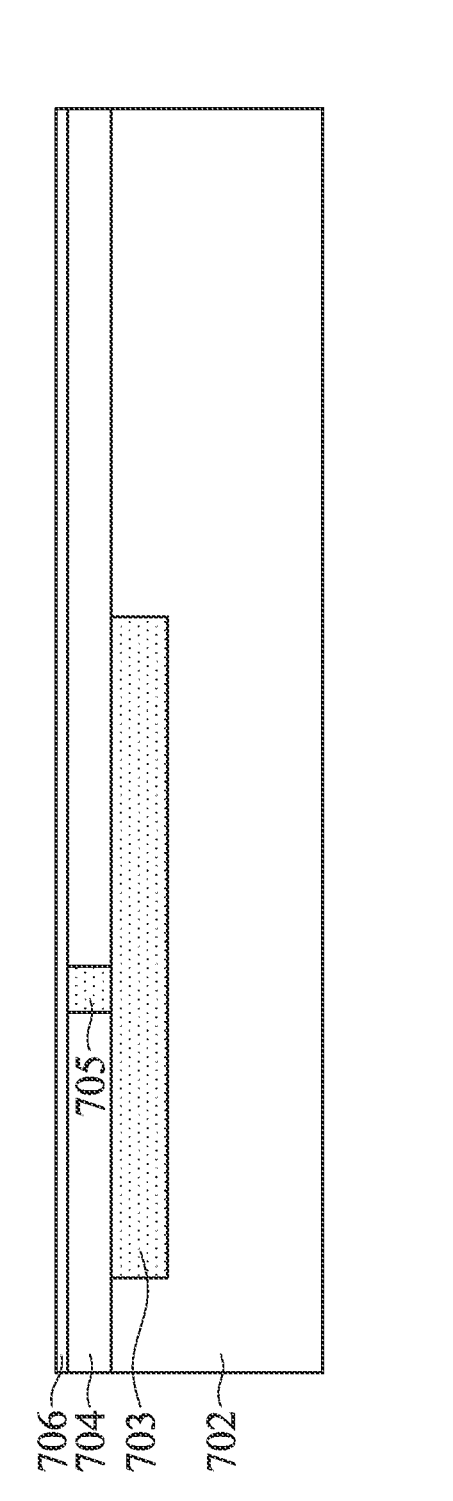

Referring to FIG. 6A, the method 600 begins at operation 602 by providing or receiving a semiconductor device (or device) 700 including a substrate 702 as illustrated in FIG. 7. In some embodiments, the substrate 702 includes silicon. Alternatively, the substrate 702 may include other elementary semiconductor such as germanium in accordance with some embodiments. In some embodiments, the substrate 702 additionally or alternatively includes a compound semiconductor such as silicon carbide, gallium arsenic, indium arsenide, and indium phosphide. In some embodiments, the substrate 702 includes an alloy semiconductor such as silicon germanium, silicon germanium carbide, gallium arsenic phosphide, and gallium indium phosphide.

In some embodiments, the substrate 702 includes a semiconductor-on-insulator (SOI) structure. For example, the substrate may include a buried oxide (BOX) layer formed by a process such as separation by implanted oxygen (SIMOX). In various embodiments, the substrate 702 includes various p-type doped regions and/or n-type doped regions, such as p-type wells, n-type wells, p-type source/drain features and/or n-type source/drain features, formed by a process such as ion implantation and/or diffusion. The substrate 702 may further include other functional features such as a resistor, a capacitor, diode, transistors (e.g., field effect transistors (FETs)), as well as source/drain contacts and gate contacts that extend to and electrically couple to source/drain features and gate structures of transistors underneath. The substrate 702 may include lateral isolation features configured to separate various devices formed on the substrate 702. In the present embodiment, a contact/LGC level as in FIG. 4 is disposed in a top portion of the substrate 702, represented by a conductive feature 703.

The device 700 includes a via-level inter-level dielectric (ILD) layer 704 (e.g., Via_0 level as in FIG. 4) deposited above the substrate 702. In some embodiments, the via-level ILD layer 704 may comprise dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric material may be formed by plasma-enhanced chemical vapor deposition (PECVD), flowable chemical vapor deposition (FCVD), or other suitable methods. In some embodiments, the dielectric material is formed of a low-k (e.g., a dielectric constant value around 3.5) dielectric material or an extreme low-k (e.g., a dielectric constant value around 2.5) dielectric material, such as carbon-containing dielectric materials, and may further contain nitrogen, hydrogen, oxygen, and combinations thereof. If an extreme low-k dielectric material is used, a curing process may be followed after depositing the extreme low-k dielectric material to increase its porosity, lower the k value, and improve the mechanical strengths. The operation 602 may also include performing one or more chemical-mechanical polishing (CMP) processes to planarize the top surface of the device 700. The via-level ILD layer 704 includes vias that extend through the via-level ILD layer 704 and provide electrical coupling to the contact features in the substrate 702. In the present embodiment, a contact via 705 (e.g., via 448 as in FIG. 4) is illustrated. The contact via 705 extends to and electrically couple to the contact/LGC level underneath.

In some embodiments, the device 700 further includes one or more inter-metal dielectric (IMD) layers (not shown) deposited above the via-level ILD layer 704. In some embodiments, each of the IMD layers may have a thickness ranging from about 12 nm to about 50 nm. The IMD layers provide electrical insulation as well as structural support for a multi-layer interconnect structures. Multi-layer interconnect structures may include a plurality of metallization layers and may further include vias or contacts of the interconnect features (e.g., back-end-of-the-line (BEOL) features) disposed in the IMD layers. For example, a metallization layer (e.g., the $M_x$ level and/or Via_x−1 level) includes a plurality of conductive features (e.g., metal lines, contacts, and/or vias) embedded in the IMD layers.

The device 700 further includes a glue layer 706 deposited above the via-level ILD layer 704. The glue layer 706 functionally provides adhesion between the via-level ILD layer 704 and a subsequently deposited metal layer thereon. The glue layer 706 also functions as an etch stop layer and provides end point control during subsequent etching processes. Material compositions of the glue layer 706 are selected such that an etch selectivity exists between the glue layer and the metal layer to form thereon, such that an etching process etching through the metal layer stops at the glue layer 706 without causing etching damages to the underlaying layer(s). The glue layer 706 may comprise Ta, TaN, Co, Ru, Ti, TiN, $M_nN_x$, Al, Mo, Ir, Rh, graphene, or a combination thereof. In some embodiments, the glue layer 706 has a thickness ranging from about 1 nm to about 3 nm.

At operation 604, the method 600 (FIG. 6A) forms a metal layer 708 over the glue layer 706, such as shown in FIG. 8. As will be discussed in later section of the present disclosure, the metal layer 708 is to pattern into metal lines that electrically couple to the contact via 705 and the contact/LGC level underneath. The metal layer 708 may comprise Cu, Ru, W, Ti, Al, Co, Mo, Ir, Rh, or the like, in some embodiments.

One process for forming metal lines or vias is known as "damascene" process. Generally, a damascene process involves forming trench-like openings in an IMD layer. A trench-like opening is typically formed using conventional lithographic and etching techniques. After the trench-like opening is formed, a diffusion barrier layer and an adhesion layer are deposited within the trench-like opening. An electro-chemical plating process is then used to fill the trench-like opening with metal or metal alloys to form a metal line and possibly a via underneath the metal line as well. Excess metal material on the surface of the IMD layer is then removed by a CMP process. With increasing packing density in microelectronic devices, copper (Cu) has been used as an interconnecting metal among other available metal materials due to its superior electrical conductivity ($5.96×10^7$ S/m) and excellent resistance against electro migration. The damascene process with copper, which involves copper electroplating followed by a CMP of the copper, has been commonly adopted for patterning copper.

An alternative process in forming metal lines includes patterning noble metals into metal lines. Noble metals have become technologically important as conductive features in integrated circuits. The term "noble metals" as used herein indicates metals selected from ruthenium (Ru), iridium (Ir), rhodium (Rh), platinum (Pt), palladium (Pd), osmium (Os), silver (Ag), and gold (Au). All other metals are herein categorized as non-noble metals. Unlike some non-noble metals, such as copper, which is not suitable for direct patterning, noble metals can be patterned to form metal lines with a CD less than about 25 nm due to the suitability of being directly patterned in dry etching approaches (e.g., reactive ion etching (RIE) process). In some embodiments, the metal layer 708 includes a noble metal, an alloy of two or more noble metals, or an alloy of noble metal(s) mixed with non-noble metal(s). In some embodiments, the metal layer 708 includes a noble metal selected from the group of Ru, Ir, Rh, and Pt, such as Ru in a specific example. In another embodiment, the metal layer 708 includes alloy of noble metals with noble or non-noble metals, such as PtIr, PdPt, or PdNi. In yet another embodiment, the metal used to form the metal layer 708 is not limited to noble metals, as long as the metal is suitable for direct patterning, such as Cobalt (Co), Molybdenum (Mo), and Tungsten (W). The metal layer 708 may be deposited by chemical vapor deposition (CVD), physical vapor deposition (PVD), electroplating, or other suitable methods. The metal layer 708 may have a thickness H1 ranging from about 12 nm to about 30 nm, in accordance with some embodiments.

At operation 606, the method 600 (FIG. 6A) forms a hard mask layer 710 on the metal layer 708, such as shown in FIG. 9. Any suitable material or composition may be used in forming the hard mask layer 710, such as a tri-layer hard mask in one example. The exemplary hard mask layer 710 includes a bottom layer, a middle layer, and a top layer (not shown), each with different or at least independent materials. For example, the bottom layer may include tetraethyl orthosilicate (TEOS), a nitrogen free anti-reflective coating (NFAARC) film, oxygen-doped silicon carbide (ODC), silicon carbon nitride (SiCN), or plasma-enhanced oxide (PEOx); the middle layer may include a silicon rich polymer material (e.g., $SiC_xH_yO_z$); the top layer may include tetraethyl orthosilicate (TEOS) or silicon oxide. It is understood that in other embodiments, one or more layers may be omitted and that additional layers may be provided as a part of the tri-layer hard mask. A photoresist layer 712 is formed on the hard mask layer 710 using a spin-coating process and soft baking process.

Figure 10:
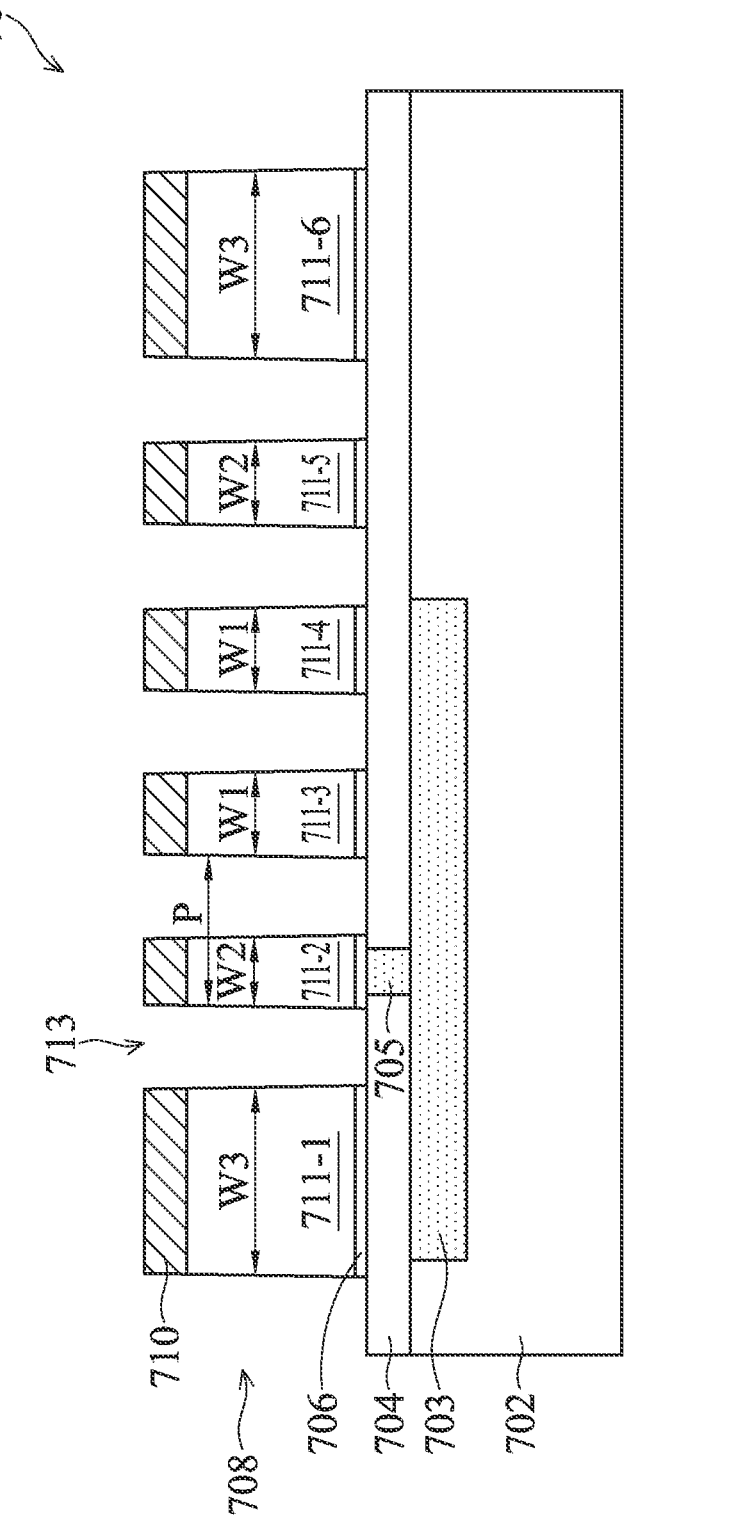

At operation 608, the method 600 (FIG. 6A) patterns the hard mask layer 710 in a lithography process and an etching process, and subsequently patterns the metal layer 708 to form metal lines 711-1 to 711-6 (collectively as metal lines 711) in a metal etching process, such as shown in FIG. 10. Trenches 713 are formed after the metal layer 708 are patterned.

The hard mask layer 710 may be patterned using suitable processes including double-patterning processes, multi-patterning processes, photolithography, self-aligned processes, and mandrel-spacer processes to define a pattern of lines to be transferred to the underneath metal layer 708. In the illustrated embodiment, the photoresist layer 712 is exposed to a radiation. The radiation may be an extreme ultraviolet (EUV) radiation using a wavelength of 13.6 nm, an ultraviolet radiation using a wavelength of 436 nm, 405 nm, or 365 nm, or a deep ultraviolet (DUV) radiation using a wavelength of 248 nm, 193 nm, or 157 nm, or other available radiation for lithography, such as e-beam. Subsequently, the exposed photoresist layer 712 is developed using post-exposure baking (PEB), developing, and hard baking thereby forming a patterned photoresist layer over the hard mask layer 710. The hard mask layer 710 is etched through the openings defined in the patterned photoresist layer, forming a patterned hard mask layer 710. The patterned photoresist layer 712 is removed thereafter using a suitable process, such as wet stripping or plasma ashing.

Still referring to FIG. 10, the method 600 at operation 608 subsequently etches the metal layer 708 in a metal etching process, using the patterned hard mask layer 710 as an etching mask. In the illustrated embodiment, the metal etching process is a dry etching process, such as a plasma etching process. In furtherance of the embodiment, the metal etching process includes an RIE process. The RIE process may include process parameters such as reactor operating pressure ranging from about 10 mTorr to about 300 mTorr, a radio frequency (RF) power less than 2700 W (e.g., ranging from about 900 W to about 1600 W), a bias voltage less than about 4500 W, a temperature ranging from about 10° C. to about 80° C., and an RIE etching period ranging from about 200 seconds to about 500 seconds. The RIE source gas may include an ion composition, such as argon (Ar), a fluorine-containing gas (e.g., $CF_4$, $SF_6$, $CH_2F_2$, $CHF_3$, $C_4F_8$, $C_2F_6$), or a combination thereof. The RIE source gas may further include certain chemical etchants, such as a chlorine-containing gas (e.g., $Cl_2$, $CHCl_3$, $CCl_4$) for chemical etching. In some embodiments, the chemical etchant comprises boron (B) (e.g., $B_2F_4$, $BCl_3$, $B_4Cl_4$, $BBr_3$). In a specific embodiment, the chemical etchant comprises a combination of boron and chlorine. In some embodiments, the total etchant flow rate is less than 1800 sccm, such as about 1200 sccm. The chemical etchant may have a flow rate about 30% to about 50% of the total etchant flow rate, such as about 40%. The resulting metal lines 711 after the patterning of the metal layer 708 may have a minimum pitch (P) ranging from about 12 nm to about 25 nm. As discussed above, the selection of metal compositions (e.g., noble metal) for the metal layer 708 safeguards bulk metal composition with low resistivity for narrow metal lines.

The metal lines 711 may have different widths, such as W1 for metal lines 711-3 and 711-4, W2 for metal lines 711-2 and 711-5, and W3 for metal lines 711-1 and 711-6 with W3>W2>W1. The widths are determined according to actual application. In the illustrated embodiment, metal lines 711-1 and 711-6 serve as power grids (e.g., Vdd and Vss lines) and metal lines 711-2, 711-3, 711-4, and 711-5 serve as signal lines.

Trenches 713 are sandwiched between adjacent metal lines 711, exposing the top surface of the glue layer 706. The glue layer 706 protects the via-level ILD layer 704 from the RIE process as an etch stop layer. Subsequently, the exposed portions of the glue layer 706 are etched in another etching process, such as a wet etching, a dry etching, or a combination thereof. The trenches 713 extends downwardly to the top surface of the via-level ILD layer 704. The etching of the hard mask layer 710, the metal layer 708, and the glue layer 706 may be in-situ.

Figure 11:
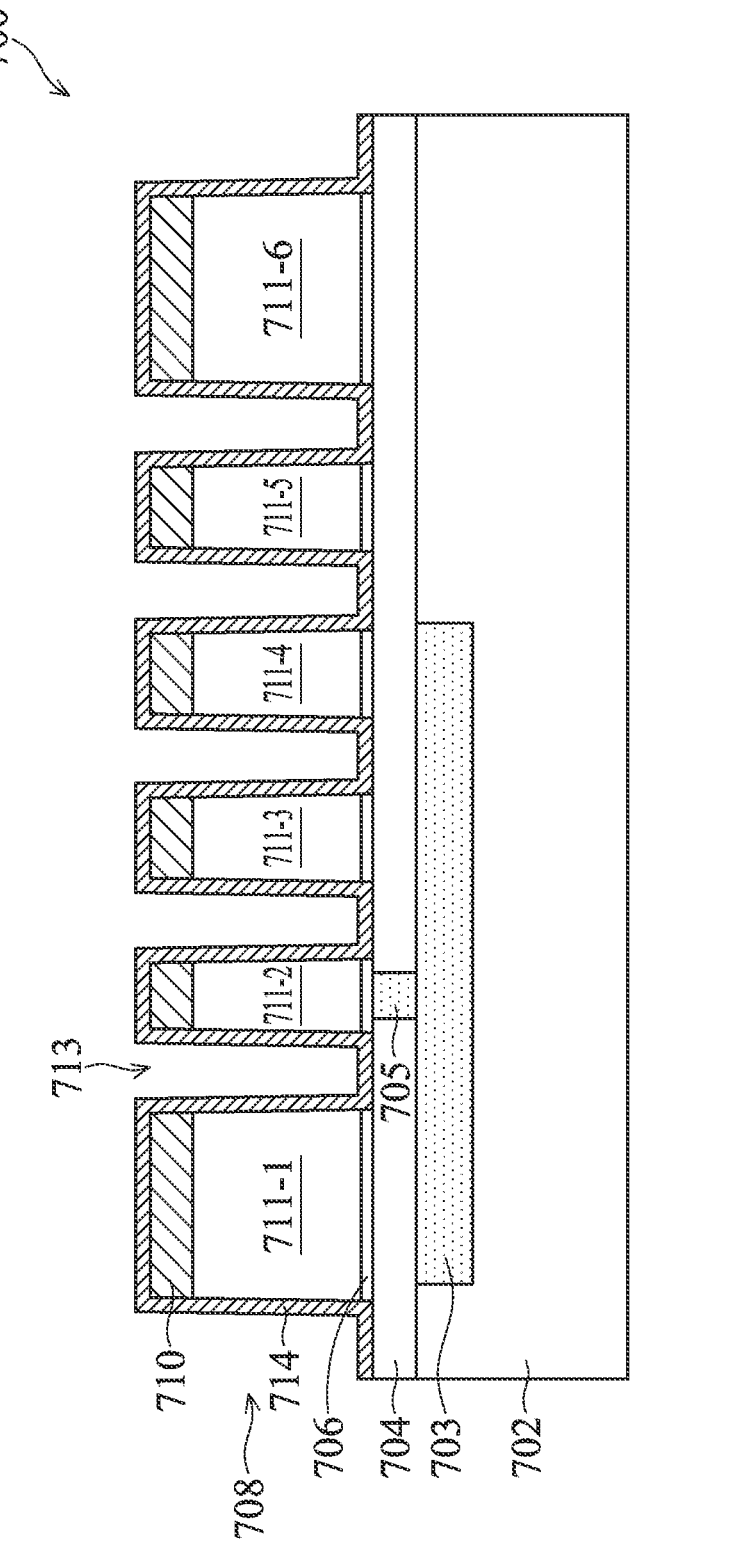

At operation 610, the method 600 (FIG. 6A) forms a barrier layer 714 that is blanket lined over sidewalls and bottom of the trenches 713 and over the hard mask layer 710, such as shown in FIG. 11. The barrier layer 714 blocks diffusion of metal atoms from the metal lines 711 into the dielectric material to be deposited in the trenches 713. The barrier layer 714 may include a nitride based dielectric or a metal oxide based dielectric, such as oxygen-doped silicon carbide (ODC), nitrogen-doped silicon carbide (NDC), hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), SiN, SiCN, or a combination thereof. The barrier layer 714 may conformally cover the device 700 with a thickness ranging from about 1 nm to about 2 nm. The barrier layer 714 may be deposited using PVD at a temperature of room temperature to about 400° C., using CVD or plasma enhanced CVD (PECVD) at a temperature of about 200° C. to about 600° C., or using ALD at a temperature of about 80° C. to about 600° C., as examples.

At operation 612, the method 600 (FIG. 6A) deposits a dielectric layer 716 filling the trenches 713 and covering the barrier layer 714, such as shown in FIG. 12. The dielectric layer 716 may be a single layer or include multiple layers of low-k dielectric materials. The dielectric layer 716 may comprise dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some other embodiments, the dielectric layer 716 may optionally include silicon oxide ($SiO_2$), silicon nitride (SiN), silicon oxynitride (SiON), ODC, NDC, or combinations thereof. The dielectric material may be formed by CVD, PECVD, FCVD, PVD, spin-on coating, or other suitable methods.

There is a need for new methods that provide low RC time constants for advanced semiconductor devices. RC time constants are reduced by lowering the specific resistance of the wiring material, and by using dielectrics with lower dielectric constants (k). Traditional semiconductor fabrication commonly employs silicon dioxide ($SiO_2$) as a dielectric, which has a k value of approximately 3.9. In some embodiments, the dielectric material is formed of a low-k (e.g., a dielectric constant value around 3.5) dielectric material or an extreme low-k (e.g., a dielectric constant value around 2.5) dielectric material, such as carbon-containing dielectric materials, and may further contain nitrogen, hydrogen, oxygen, and combinations thereof. If an extreme low-k dielectric material is used, a curing process may be followed after depositing the extreme low-k dielectric material to remove moisture in the extreme low-k dielectric material. In the illustrated embodiment, the dielectric material is deposited in an FCVD process, which has a better gap filling capability such that the trenches 213 are substantially filled up with the dielectric material.

Besides using a low-k or extreme low-k dielectric material, another approach is to implement an air gap, which is provided in the form of an air-gap-containing interconnect structure. Even a small air gap near the metal lines results in a significant improvement in the overall k for a structure, e.g., an air gap from about 35% to about 40% in volume between signal lines will reduce capacitance by approximately 15%. As used herein, the term "air gap" is used to describe a void defined by surrounding substantive features, where a void may contain air, nitrogen, ambient gases, gaseous chemicals used in previous or current processes, or combinations thereof.

Figure 13:
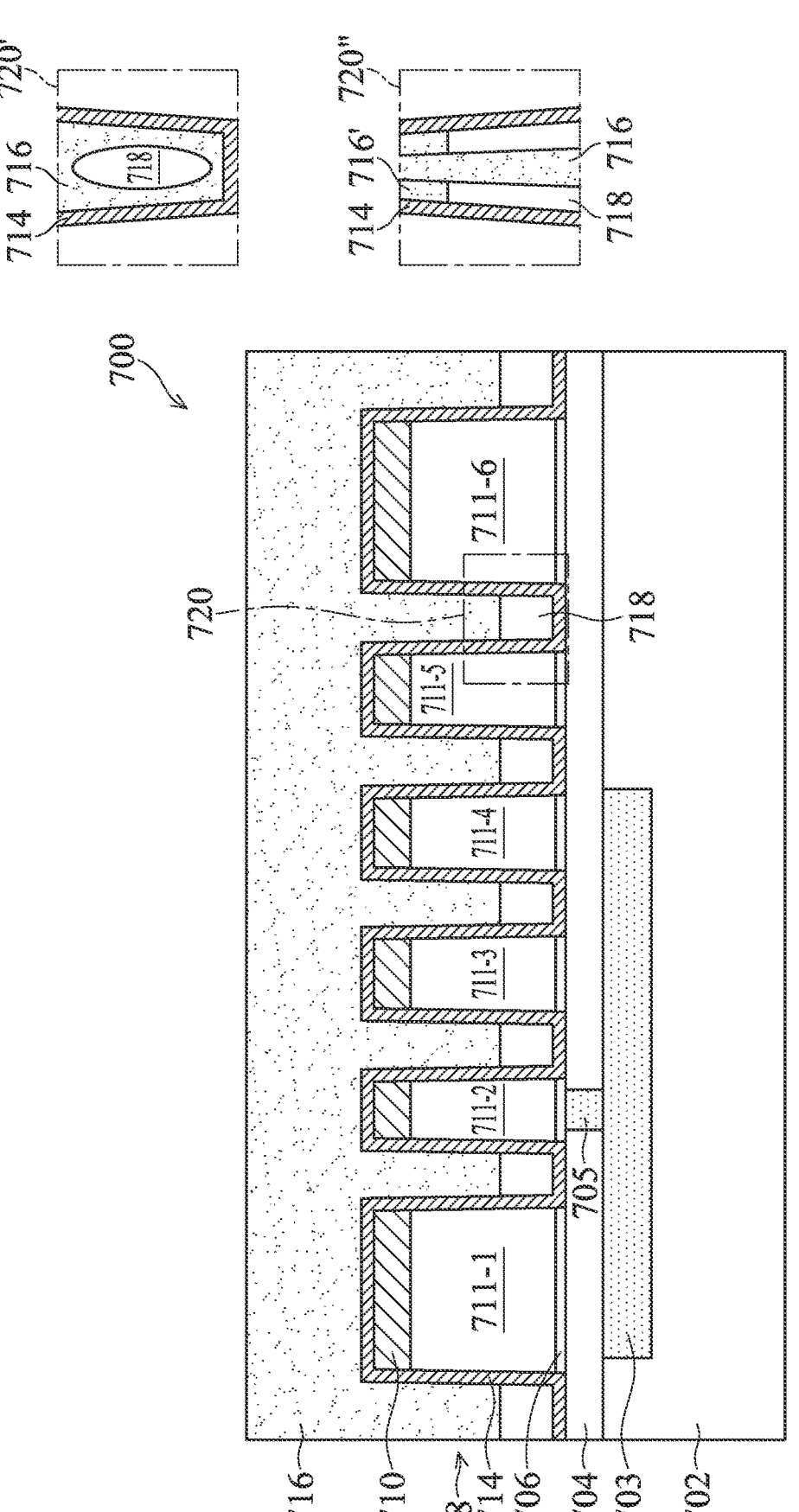

In some embodiments, the deposition process has a poor gap filling capability (e.g., a CVD process), such that the trenches 713 are capped by the dielectric material with air gaps formed therein. Referring to FIG. 13 for such an embodiment, the trenches 713 have a high aspect ratio and the parameters in a deposition process (e.g., pressure, temperature, and gas viscosity of a CVD process) are tuned in a way that the gap fill behavior of depositing dielectric materials cap the air gaps 718 inside the trenches 713 without filling up the trenches. In some embodiments, the air gaps 718 are associated with a k≈1. Accordingly, the air gaps 718 of the interconnect structure facilitates improved RC performance with respect to a continuous dielectric material with a higher k. However, gap materials other than air are contemplated. In some embodiments, an air gap 718 has a width in a range from about 0.1 nm to about 10 nm. As shown in a region 720 at the bottom of the trench 713, an air gap 718 is capped with the dielectric layer 716. The air gap 718 still exposes a portion of the barrier layer 714. Region 720' shows an alternative embodiment, in which the air gap 718 is surrounded by the dielectric material of the dielectric layer 716 and has an oval shape. Region 720" shows yet another alternative embodiment, in which the air gaps 718 are on both sides of the dielectric layer 716 and capped by a dielectric layer 716'. The dielectric layer 716' may have the same or different dielectric materials with the dielectric layer 716. This alternative embodiment may be formed by depositing the dielectric layer 716, etching the dielectric layer 716 to form trenches, depositing spacer on sidewalls of the trenches, depositing the barrier layer 714 and metal material(s) of the metal layer 708 in the trenches, thereby forming the metal lines 711, such as in a damascene (or dual damascene) process. Subsequently, the spacer (now laterally stacked between the dielectric layer 716 and the barrier layer 714 is selectively removed to form the air gap 718, and the dielectric layer 716' is deposited to cap the air gap 718. In this alternative embodiment, since the dielectric layer 716 is deposited prior to the formation of the metal lines 711, resulting in sidewalls of the metal lines 711 tapering outwardly from bottom to top.

At operation 614, the method 600 (FIG. 6A) performs a planarization process, such as a CMP process to remove excess dielectric material of the dielectric layer 716. In some embodiments, the barrier layer 714 and the hard mask layer 710 are also removed from above the metal lines 711, such that the top surfaces of the metal lines 711 are exposed, such as shown in FIG. 14. After the planarization, top surfaces of the metal lines 711, the barrier layer 714, and the dielectric layer 716 are substantially coplanar. In FIG. 14 and the following figures, the manufacturing operations based on the structure shown in FIG. 13 with air gaps as in the region 720 are explained. However, the same operations can be applied to the structures shown in FIG. 12 and alternative embodiments as in the regions 720' and 720" in FIG. 13 as well.

At operation 618, the method 600 (FIG. 6B) deposits an etch stop layer 722 over the device 700, such as shown in FIG. 15. Any suitable material or composition may be used in forming the etch stop layer 722. The etch stop layer 722 may be a single layer or multiple layers comprising SiCN, SiOC, SiO, SiN, AlON, metal oxide (e.g., AlO, ZrO, carbon-doped AlO, etc.), or the like. The etch stop layer 722 may be formed using ALD or CVD process, for example an ALD process in a chamber having a pressure of about 1 Torr to about 30 Torr, a frequency of about 13.56 MHz, at a power level of about 50 W to about 500 W, at a temperature of about 100° C. to about 400° C., and in the presence of or in an ambient of $N_2$, $H_2$, or $NH_3$. A planarization process, such as a CMP process, may subsequently be perform to planarize a top surface of the device 700.

Figure 16:
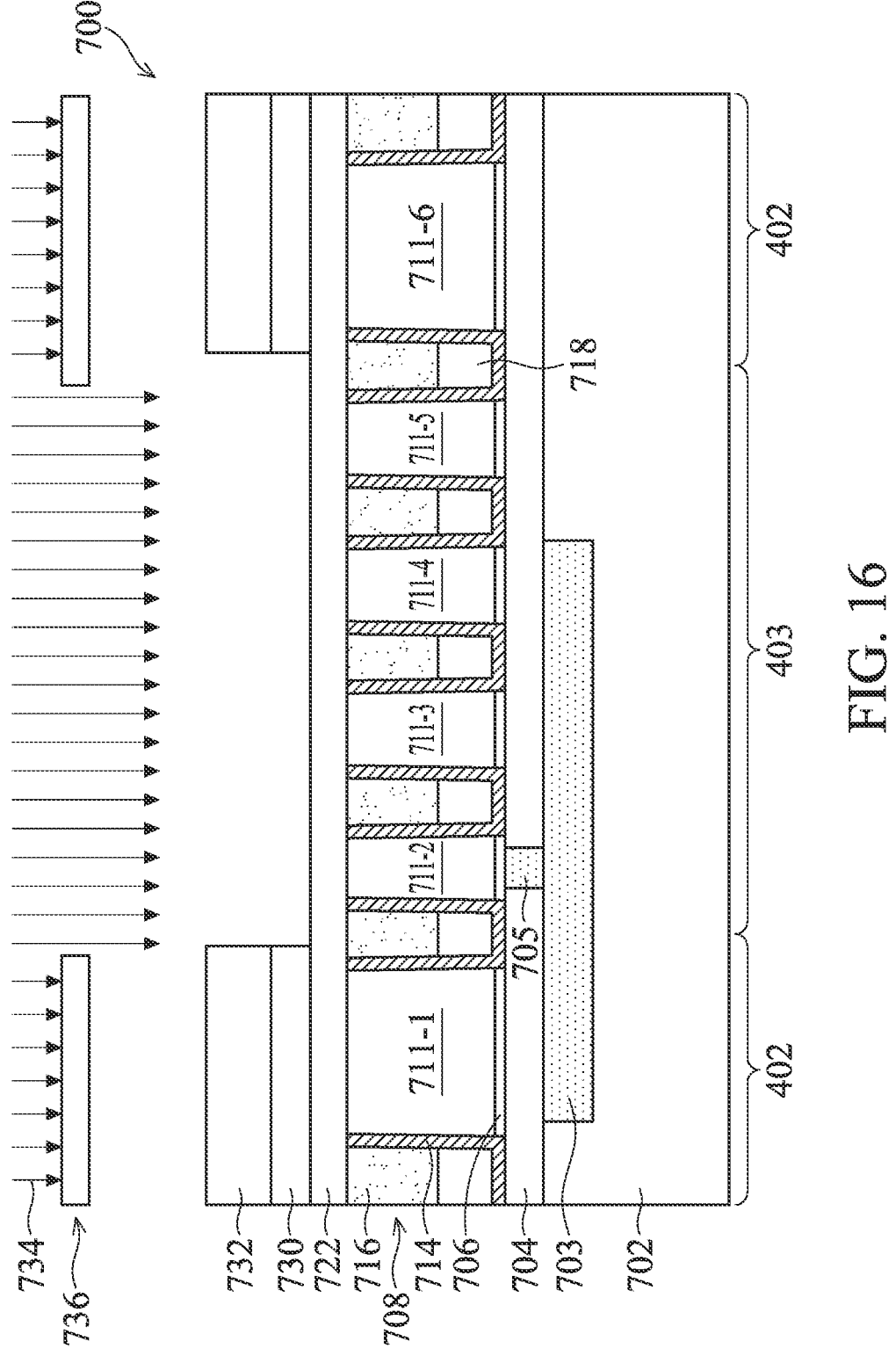

At operation 620, the method 600 (FIG. 6B) forms a hard mask layer 730 on the etch stop layer 722, such as shown in FIG. 16. Any suitable material or composition may be used in forming the hard mask layer 730, such as a tri-layer hard mask in one example. The exemplary hard mask layer 730 includes a bottom layer, a middle layer, and a top layer (not shown), each with different or at least independent materials. For example, the bottom layer may include tetraethyl orthosilicate (TEOS), a nitrogen free anti-reflective coating (NFAARC) film, oxygen-doped silicon carbide (ODC), silicon carbon nitride (SiCN), or plasma-enhanced oxide (PEOx); the middle layer may include a silicon rich polymer material (e.g., $SiC_xH_yO_z$); the top layer may include tetraethyl orthosilicate (TEOS) or silicon oxide. It is understood that in other embodiments, one or more layers may be omitted and that additional layers may be provided as a part of the tri-layer hard mask.

A photoresist layer 732 is formed on the hard mask layer 730 using a spin-coating process and soft baking process. Then, the photoresist layer 732 is exposed to a radiation 734. The radiation 734 is masked by a photomask 736 fabricated in a mask house (e.g., the mask house 830 in FIG. 24) based on determination of an optimal automatic-place-and-route (APR) tool regarding what regions are low-capacitance regions to be recessed (e.g., regions 403 in FIGS. 4 and 16). Regions other than low-capacitance regions 403 are determined as low-resistance regions 402 in the present embodiment, or vice versa. The low-capacitance regions 403 correspond to transparent regions in the photomask 736 allowing the radiation 734 to pass through, such that only a portion of the photoresist layer 732 corresponding to low-capacitance regions is exposed in the radiation 734. In some embodiments, the low-resistance regions 402 include power grids and the low-capacitance regions 403 include signal lines. In furtherance of some embodiments, the low-resistance regions 402 include power grids and bit lines of SRAM and the low-capacitance regions 403 includes signal lines other than bit lines.

The radiation 734 may be an extreme ultraviolet (EUV) radiation using a wavelength of 13.6 nm, an ultraviolet radiation using a wavelength of 436 nm, 405 nm, or 365 nm, or a DUV radiation using a wavelength of 248 nm, 193 nm, or 157 nm, or other available radiation for lithography, such as e-beam. In the case of e-beam lithography (which is maskless lithography), the "photomask" is in the form of a direct-write data pattern rather than a physical apparatus.

Still referring to FIG. 16, in the illustrated embodiment, the exposed photoresist layer 732 is developed using post-exposure baking (PEB), developing, and hard baking thereby forming a patterned photoresist layer over the hard mask layer 730. The patterned photoresist layer defines low-capacitance regions for metal lines (e.g., metal lines 711-2, 711-3, 711-4, and 711-5) therein to be recessed, which will be transferred to the hard mask layer 730 first and eventually to the respective metal lines 711. Subsequently, the hard mask layer 730 is etched through the openings of the patterned photoresist layer, forming a patterned hard mask layer. The patterned photoresist layer is removed thereafter using a suitable process, such as wet stripping or plasma ashing.

The etch stop layer 722 is etched through the openings defined in the patterned hard mask layer 730, forming a patterned etch stop layer 722. In one example, the etching process includes applying a dry (or plasma) etch to partially remove the etch stop layer 722 within the openings defined in the patterned hard mask layer 730. In another example, the etching process includes applying a wet etch with a hydrofluoric acid (HF) solution to partially remove the etch stop layer 722 within the openings defined in the patterned hard mask layer 730, such that no etch stop layer 722 remains in the low-capacitance regions 403.

Figure 17:
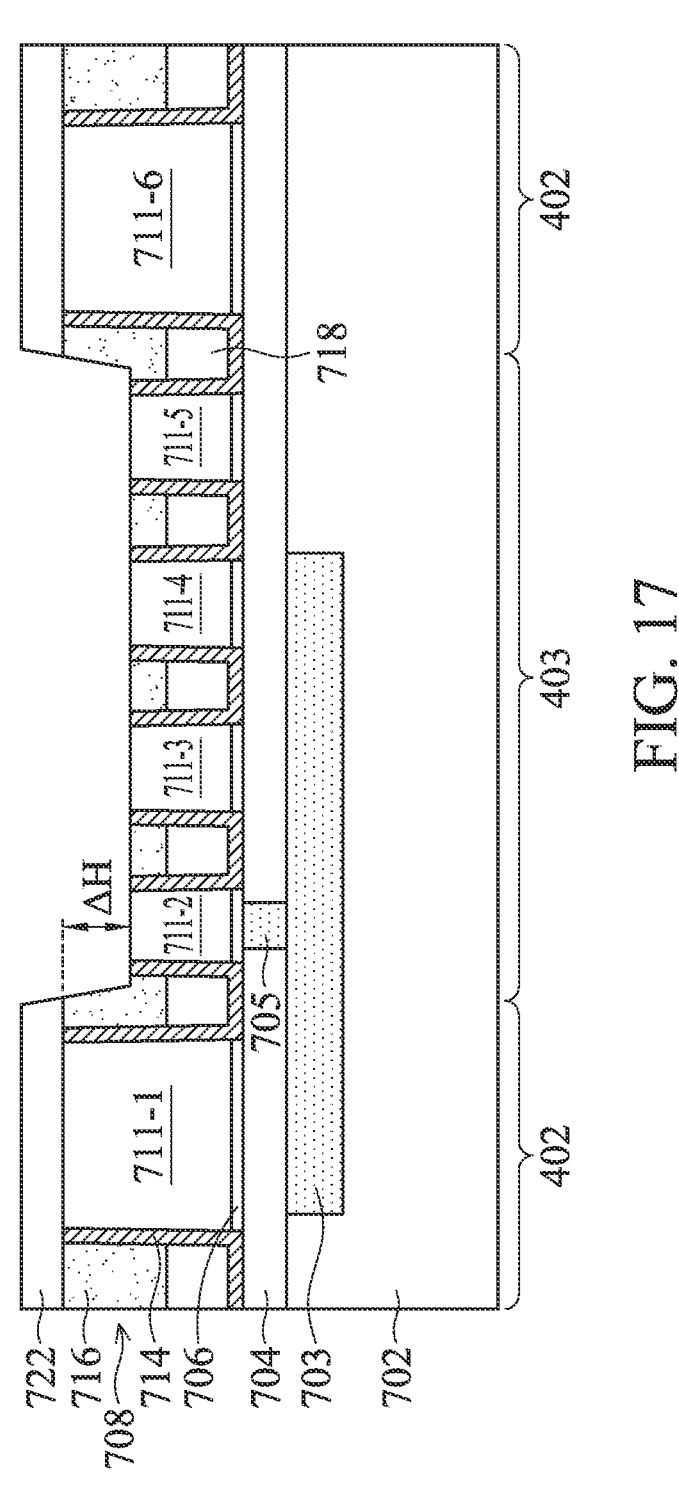

At operation 622, the method 600 (FIG. 6B) recesses the metal lines 711 in the identified low-capacitance regions by performing a metal etching process using the patterned hard mask layer 730 and the patterned etch stop layer 722 as an etching mask. The resultant structure after operation 622 is shown in FIG. 17. In the illustrated embodiment, the metal recessing process is a dry etching process, such as a plasma etching process. In furtherance of the embodiment, the metal recessing process includes an RIE process. The RIE process may include process parameters such as reactor operating pressure ranging from about 10 mTorr to about 300 mTorr, an RF power less than 2700 W (e.g., ranging from about 900 W to about 1600 W), a bias voltage less than about 4500 W, a temperature ranging from about 10° C. to about 80° C., and an RIE etching period ranging from about 200 seconds to about 500 seconds. The RIE source gas may include an ion composition, such as argon (Ar), a fluorine-containing gas (e.g., $CF_4$, $SF_6$, $CH_2F_2$, $CHF_3$, $C_4F_8$, $C_2F_6$), or a combination thereof. The RIE source gas may further include certain chemical etchants, such as a chlorine-containing gas (e.g., $Cl_2$, $CHCl_3$, $CCl_4$) for chemical etching. In some embodiments, the chemical etchant comprises boron (B) (e.g., $B_2F_4$, $BCl_3$, $B_4Cl_4$, $BBr_3$). In a specific embodiment, the chemical etchant comprises a combination of boron and chlorine. In some embodiments, the total etchant flow rate is less than 1800 sccm, such as about 1200 sccm. The chemical etchant may have a flow rate about 30% to about 50% of the total etchant flow rate, such as about 40%. The metal lines 711 may be recessed for a distance ΔH at least about 3 nm. As discussed above, if the metal height reduction is less than 3 nm, the parasitic capacitance may not be reduced sufficiently. The metal etching process also recesses the dielectric layer 716 in the low-capacitance regions. The dielectric layer 716 located at boundaries of the low-resistance region 402 and the low-capacitance region 403 may be partially recessed, resulting in a first top surface coplanar with a top surface of the metal line 711-1 and a second top surface coplanar with recessed metal lines 711-2 to 711-5.

Figure 18:
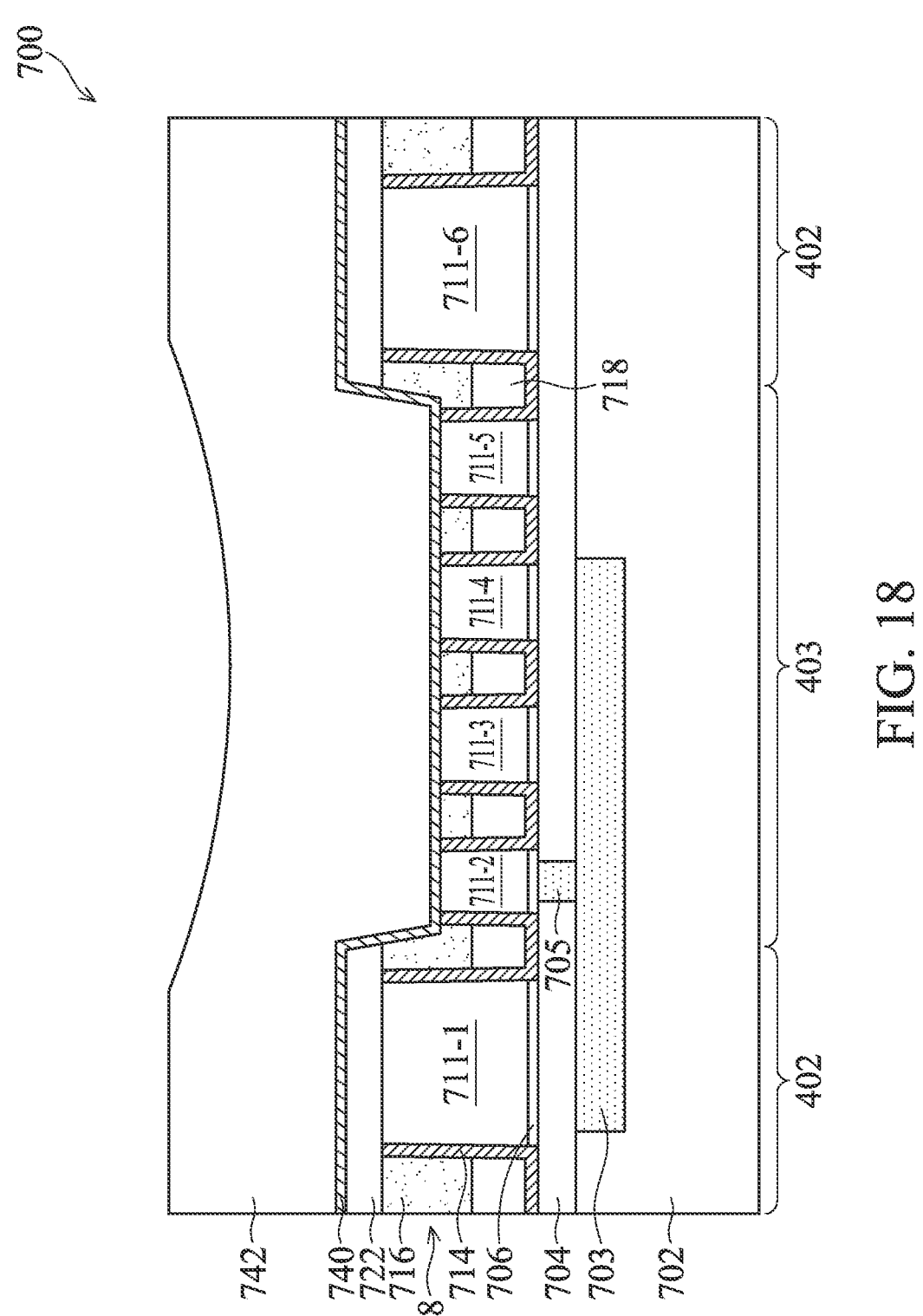

At operation 624, the method 600 (FIG. 6B) may optionally deposit an etch stop layer 740 over the device 700, such as shown in FIG. 18. Any suitable material or composition may be used in forming the etch stop layer 740. The etch stop layer 740 may be a single layer or multiple layers comprising SiCN, SiOC, SiO, SiN, AlON, metal oxide (e.g., AlO, ZrO, carbon-doped AlO, etc.), or the like. Material compositions of the etch stop layer 740 are different from the etch stop layer 722, such that an etch selectivity exists between the etch stop layers 722 and 740. The etch stop layer 740 may be formed using atomic layer deposition (ALD) or chemical vapor deposition (CVD) process, for example an ALD process in a chamber having a pressure of about 1 Torr to about 30 Torr, a frequency of about 13.56 MHz, at a power level of about 50 W to about 500 W, at a temperature of about 100° C. to about 400° C., and in the presence of or in an ambient of $N_2$, $H_2$, or $NH_3$. The dielectric layer 716 at the boundaries of the regions 402 and 403 has a first top surface in contact with the etch stop layer 722 and a slanted sidewall and a second top surface in contact with the etch stop layer 740. Alternatively, the forming of the etch stop layer 740 may be skipped.

Figure 19:
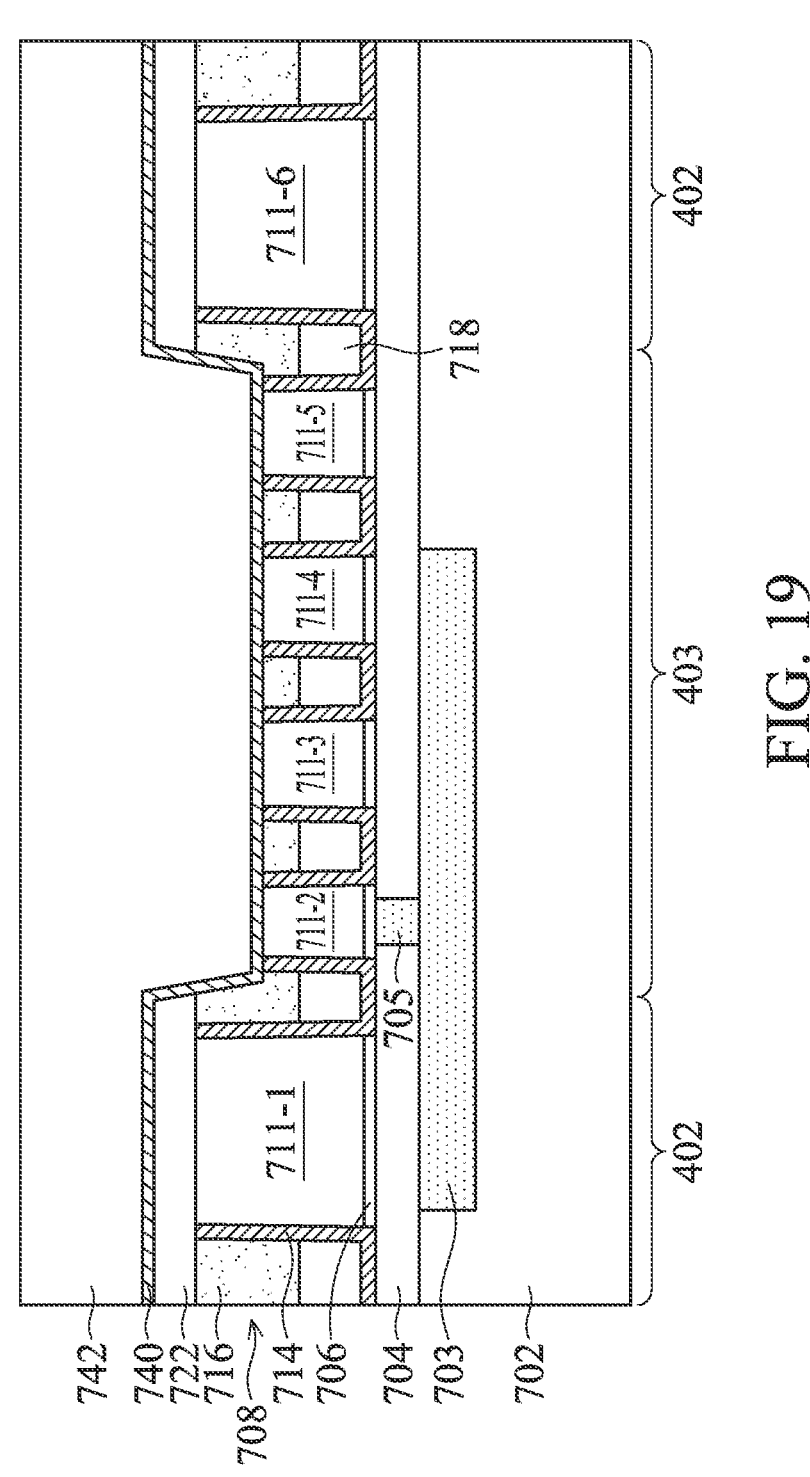

Still referring to FIG. 18, the method 600 at operation 624 also forms a dielectric layer 742 over the device 700 (over the etch stop layer 740 if presents). In some embodiments, the dielectric layer 742 includes silicon oxide, silicon nitride, a low-k material, an extreme low-k material, or a combination thereof. The formation of the dielectric layer 742 may include CVD, PECVD, FCVD, PVD, spin-on coating, or other suitable methods. In some embodiments, the dielectric layer 742 is similar to the dielectric layer 716 in term of material composition and deposition. In some alternative embodiments, the dielectric layer 742 and the dielectric layer 716 include different material compositions. For example, the dielectric layer 716 may have a higher dielectric constant (k) than that of the dielectric layer 742. A top surface of the dielectric layer 742 may have a dishing profile, as shown in FIG. 18. The dishing profile is due to the recessed top surface in the low-capacitance regions 403. After the deposition of the dielectric layer 742, a planarization process, such as a CMP process, may be applied to planarize the top surface of the device 700. The resultant structure after the planarization process is shown in FIG. 19.

Figure 20:
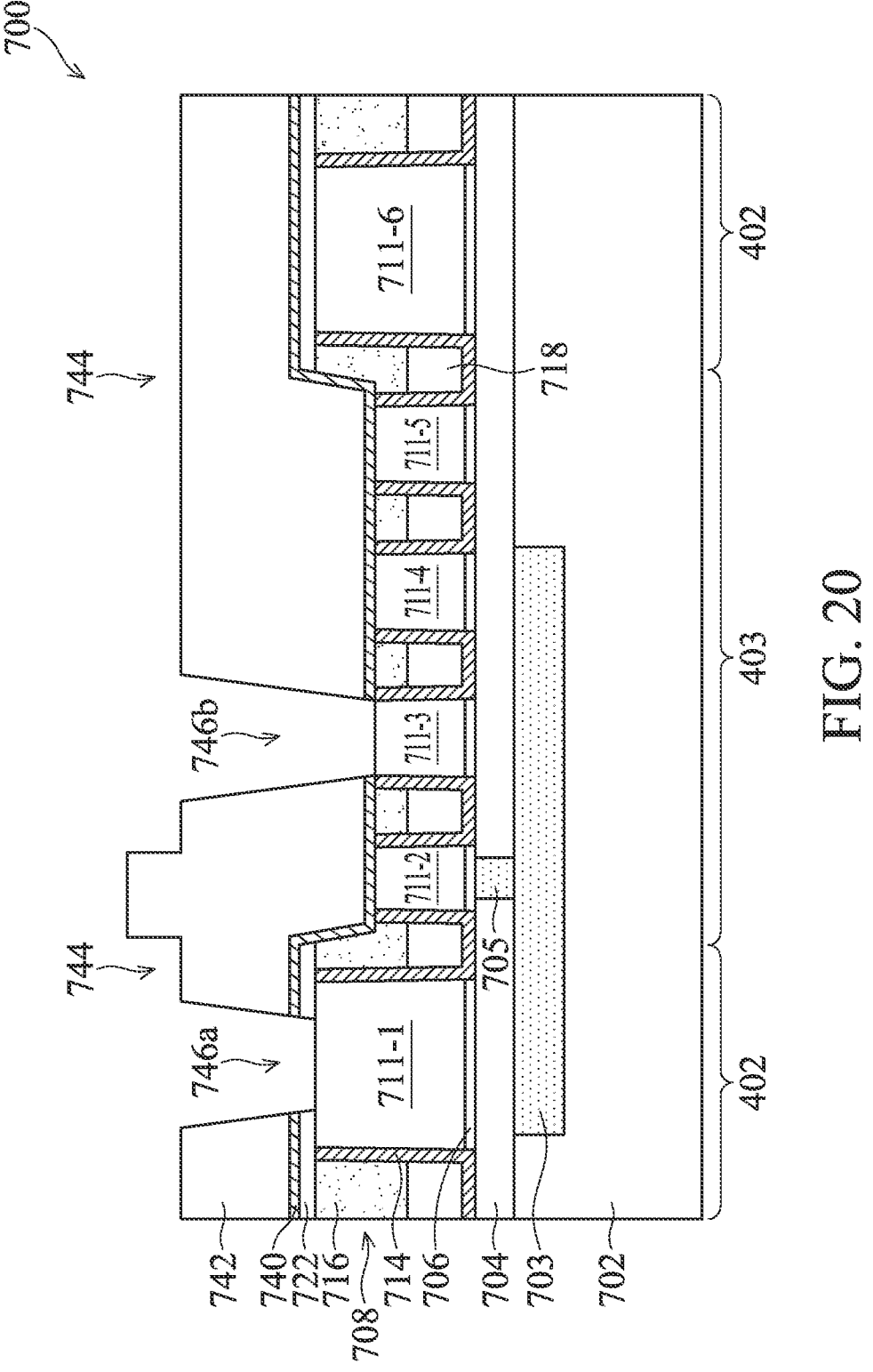

At operation 626, the method 600 (FIG. 6B) forms openings in the dielectric layer 742 through one or more etching processes. Referring to FIG. 20, the exemplary openings include the trench openings 744 and the via openings 746a in the low-resistance regions 402 and the via openings 746b in the low-capacitance regions 403. The via openings 746b is deeper than the via openings 746 a due to the recessed top surface in the low-capacitance regions 403.

In some embodiments, operation 626 includes removing a top portion of the dielectric layer 742 in a first etching process to form the trench openings 744. The first etching process is implemented to partially etch the dielectric layer 742, such as by controlling the etching duration. During the first etching process, the dielectric layer 742 within the region defined by the trench opening 744 is only recessed but not completely through the dielectric layer 742. The formation of the trench opening 744 may be assisted by photoresist (not shown) for defining patterns. Photoresist is then removed in a suitable process such as resist stripping or plasma ashing. The dielectric layer 742 is further etched through the trench opening 744 by a second etching process to form the via openings 746a and 746b. The second etching process is designed to selectively etch the dielectric layer 742 while the etch stop layer 740 substantially remains intact. The second etching process extends the via openings 746a and 746b downwardly, reaching the etch stop layer 740. The formation of the via openings 746a and 746b may also be assisted by photoresist (not shown) for defining patterns. Photoresist is then removed in a suitable process such as resist stripping or plasma ashing. After the second etching process, both the trench opening 744 for metal lines and the via openings 746a and 746b for via features are collectively formed in the dielectric layer 742. The trench openings 744 is formed in the upper portion of the dielectric layer 742 and the via openings 746a and 746b are formed in the lower portion of the dielectric layer 742.

In some embodiments, each of the first and second etching processes includes dry etch, wet etch or a combination thereof. The second etching process is designed with an etchant to have etching selectivity such that the second etching process substantially removes the dielectric material in the dielectric layer 742 while keeps the etch stop layer 740 intact. In some embodiments, the etchants used in the first and second etching process are the same. In some embodiments, the second etching process is a dry etch with more etching directionality. In some embodiments, the etchant in the second etching process includes fluorine-containing gas (such as $C_xF_y$, which x and y are proper integers), oxygen-containing gas (such as (2), other suitable etching gas, or a combination thereof.

Still referring to FIG. 20, after the formation of the trench opening 744 and the via openings 746a and 746b, a third etching process, such as a wet etch or a dry etch, is applied to open the etch stop layer 740 and the etch stop layer 722. In some embodiments, the third etching process is designed to first selectively etch the etch stop layer 740 relative to the etch stop layer 722, then selectively etch the etch stop layer 722 to expose the underneath metal lines 711.

Figure 21:
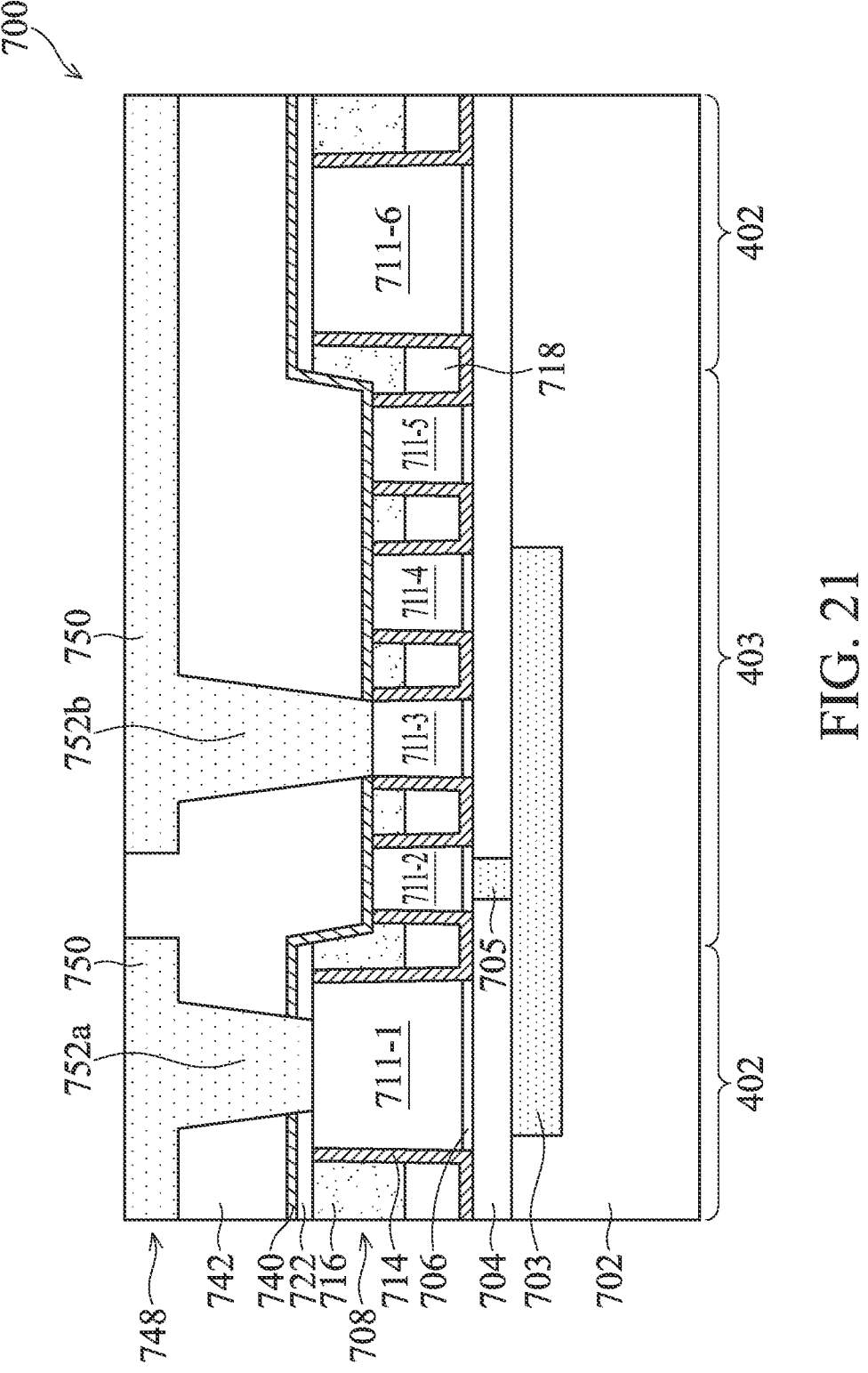

At operation 628, the method 600 (FIG. 6B) forms overlying conductive features 748 in the trench openings 744 and the via openings 746a and 746b, such as shown in FIG. 21. The portions of the overlying conductive features 748 in the trench openings 744 are also referred to as metal lines 750, and the portions in the via openings 746a and 746b are also referred to as vias 752a and 752b, respectively.

In some embodiments, the overlying conductive features 748 are formed as a bulk metal layer by filling a conductive material in the trench openings 744 and via openings 746a and 746b. The conductive material may be deposited through suitable techniques such as an electroplating process, PVD, or other suitable methods. In one embodiment, the overlying conductive features 748 are formed by a damascene process, such as a dual damascene process. One advantageous feature of having the bulk metal layer formed in a damascene process is that some low-resistive conductive material (e.g., copper) may not otherwise be suitable for metal etching process. In some embodiments, the conductive material is different from the metal used in the relatively narrow metal lines 711. In some embodiments, the metal lines 711 includes one or more noble metals as discussed above, while the bulk metal layer 748 includes one or more non-noble metals. For example, the bulk metal layer 748 may include copper (Cu), although other suitable materials such as tungsten (W), cobalt (Co), Nickel (Ni), aluminum (Al), combinations thereof, and/or the like, may alternatively be utilized. In some embodiments, the bulk metal layer 748 also includes a noble metal but different from the one used in the metal lines 711. For example, the bulk metal layer 748 may include Pt, while the metal lines 711 may include Ru, Ir, or Rh. In some alternative embodiments, the metal lines 711 and the bulk metal layer 748 both include non-noble, but different metals. For example, the metal lines 711 may include Mo or W, while the bulk metal layer 748 may include Cu.

The dielectric layer 742 and the metal lines 750 and vias 752 disposed in the dielectric layer 742 collectively form a layer of interconnect structure (e.g., the $M_{x+1}$ level and Via_x level). The vias 752a and 752b extend through the dielectric layer 742 and come into direct contact with the respective metal lines 711. In the low-resistance region 402, the routing path from metal line 711-1 to the metal line 750 directly above is through the via 752a. In the low-capacitance region 403, the routing path from metal line 711-3 to the metal line 750 directly above is through the via 752b. Since the metal line 711-1 is thicker than metal line 711-3, the via 752a is shorter than the via 752b. The routing path in the low-resistance region 402 is thus less resistive than the routing path in the low-capacitance region 403. On the other hand, the distance between the metal line 711-3 and the metal line 750 directly above is enlarged, parasitic capacitance therebetween is reduced. Accordingly, the RC delay is reduced in each region, and the device performance may be improved as well.

Figure 22:
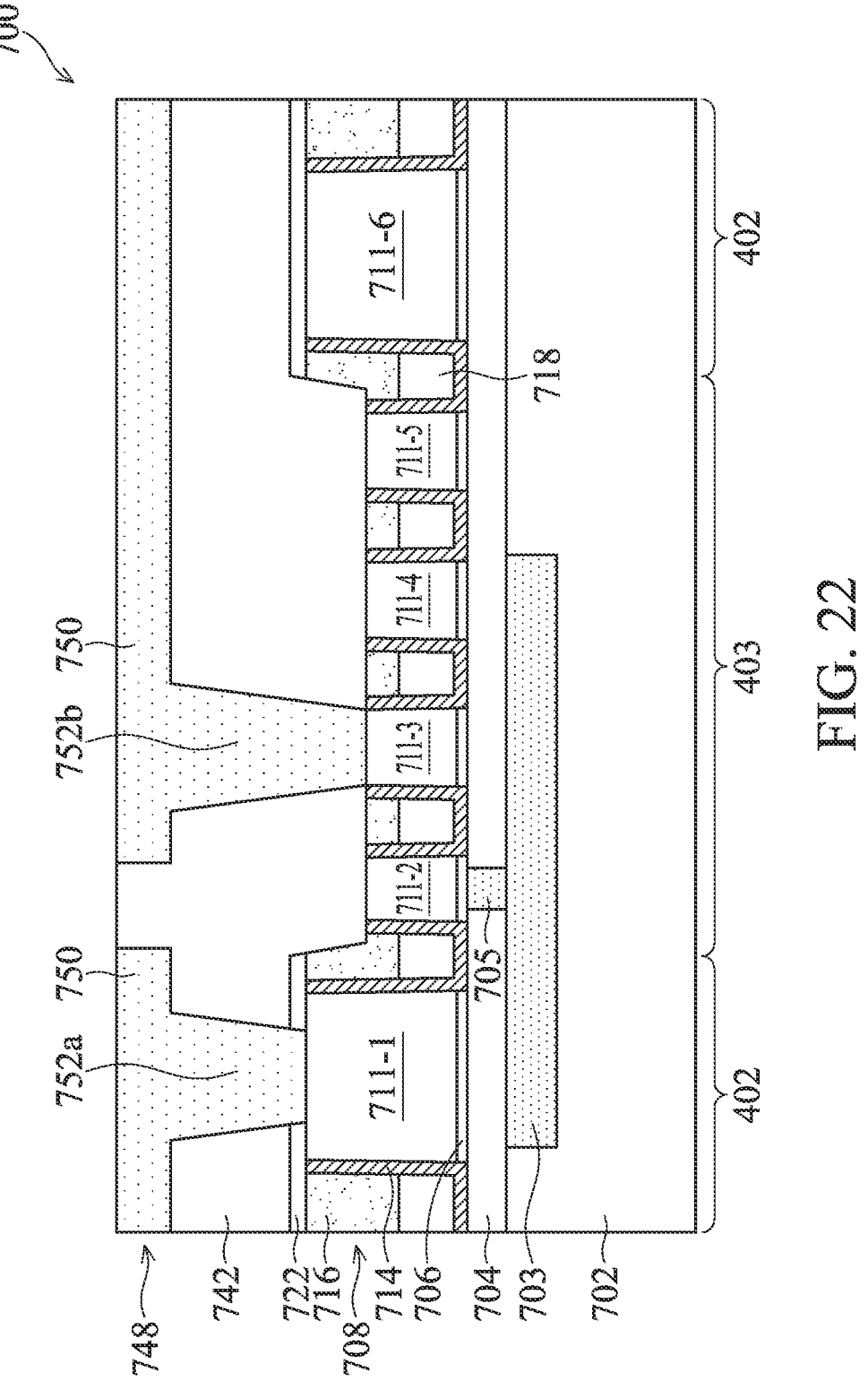
Figure 23:
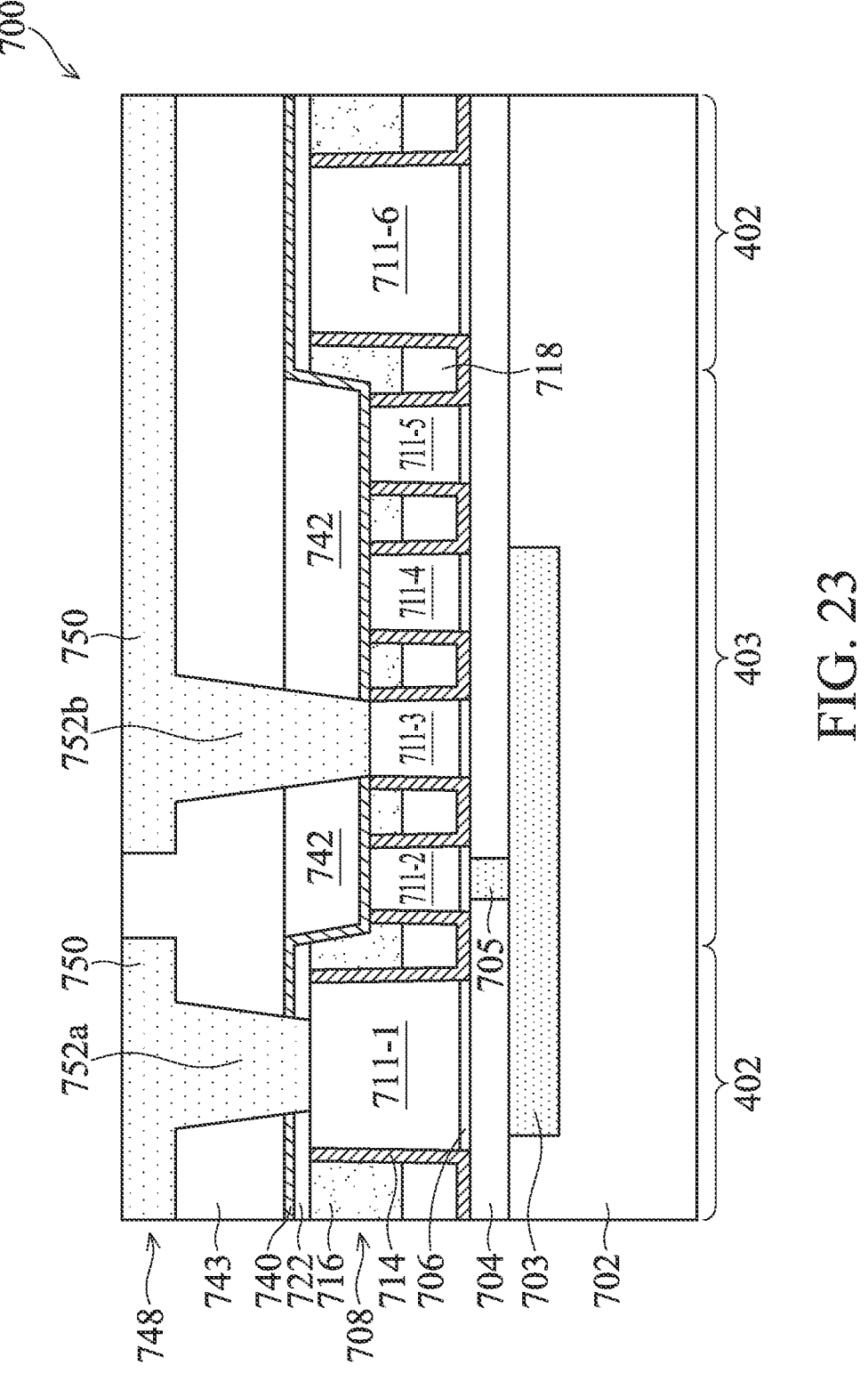

FIGS. 22 and 23 similarly illustrate other embodiments of the resultant structure after operation 628. The main difference between the embodiments in FIGS. 22 and 21 is that the forming of the etch stop layer 740 is skipped, such that the dielectric layer 742 is in contact with the recessed top surface of the metal lines 711 and the dielectric layer 716 in the low-capacitance region 403. The main difference between the embodiments in FIGS. 23 and 21 is that an extra planarization process (e.g., a CMP process) is performed to remove the dielectric layer 742 from the low-resistance regions 402 and an extra dielectric layer 743 is deposited. The material composition of the dielectric layer 743 is different from the dielectric layer 742 and may be different or the same with the dielectric layer 716. The etch stop layer 740 may serve as a stop layer during the planarization process, such that a thickness of the etch stop layer 740 in the regions 402 is less than in the regions 403 due to the planarization loss. Alternatively, the etch stop layer 740 may be completely removed from the regions 402 by the planarization process but still remain in the regions 403.

At operation 630, the method 600 (FIG. 6B) performs further fabrication processes to the device 700. For example, it may similarly recess the conductive features 748 in the low-capacitance regions 403 and form more overlying layers of interconnect structure thereabove. Alternatively, it may form more overlying layers of interconnect structure without recessing the conductive features 748 in the low-capacitance regions 403. The method 600 at operation 630 may further form passivation layers on the device 700, perform other back-end-of-line (BEOL) processes, and complete the integrated circuit chip.

Figure 24:
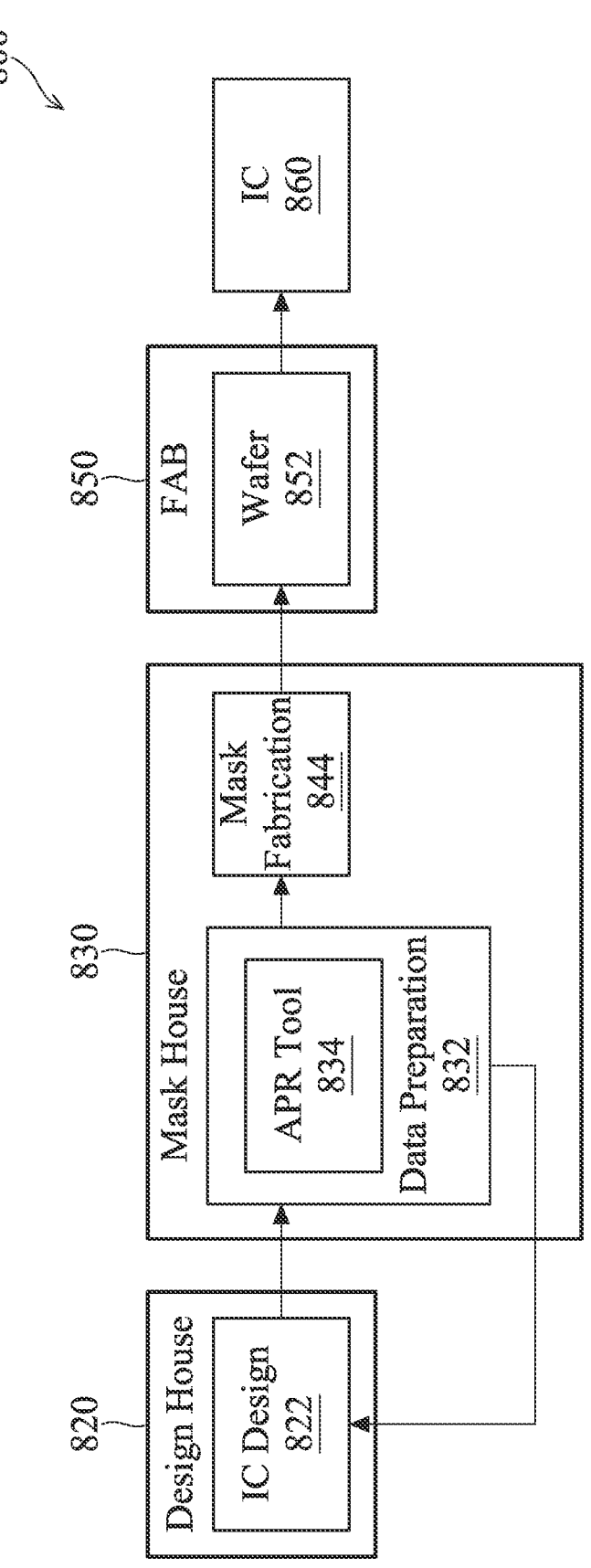
FIG. 24 shows a block diagram of an IC manufacturing flow, in accordance with some embodiments of the present disclosure.
Figure 26:
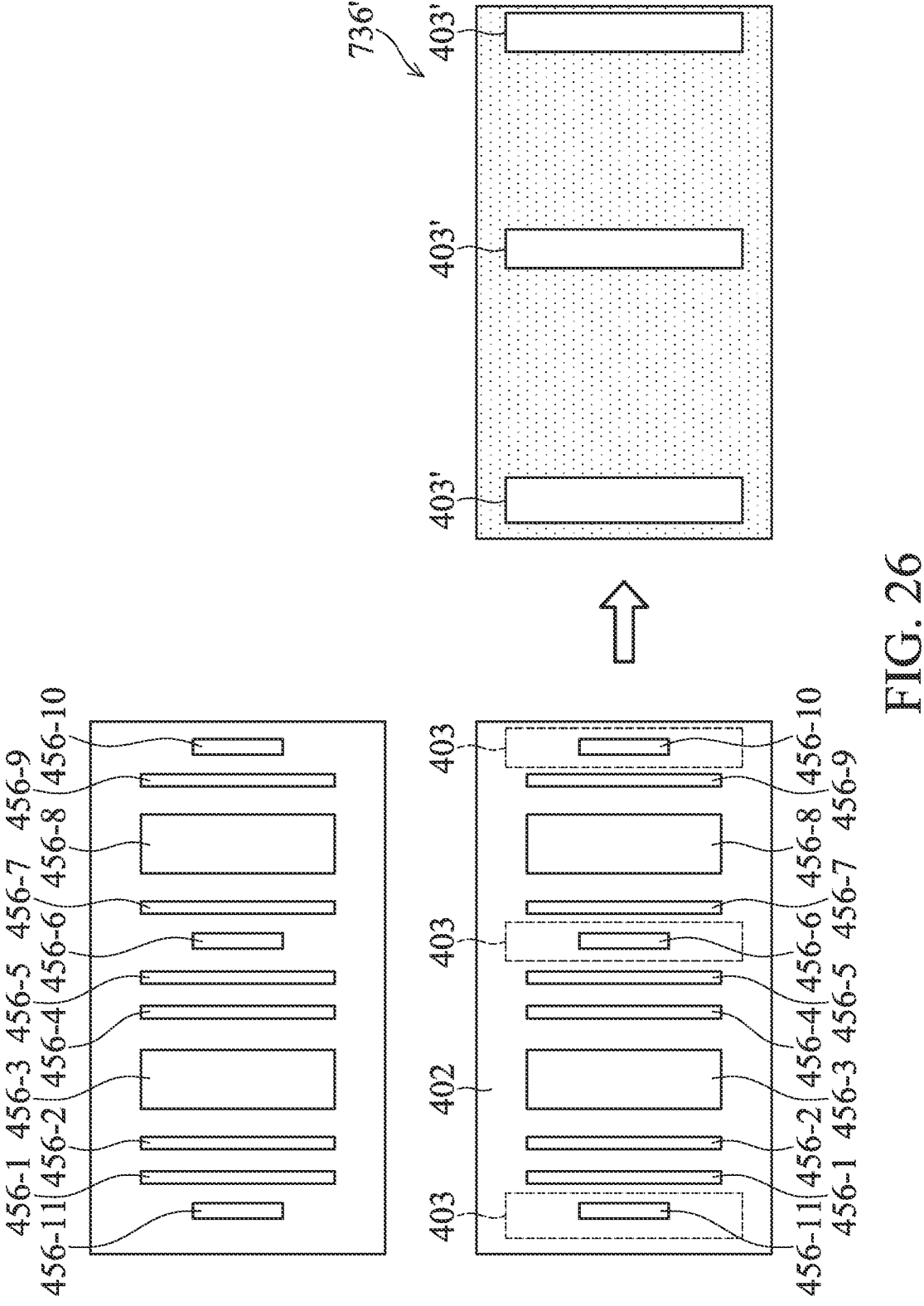
FIG. 26 illustrates an exemplary IC layout with metal lines in regions sensitive to resistance and in regions sensitive to capacitance, in accordance with some embodiments of the present disclosure.

Reference is now made to FIGS. 24, 25, and 26. Determining low-resistance regions and low-capacitance regions may be performed at a design stage by design engineers and/or layout engineers. Alternatively or additionally, it may be performed at a later stage after the design stage, for example, by a foundry in a fabrication stage. FIG. 24 is a simplified block diagram of an embodiment of an IC manufacturing system 800 and an IC manufacturing flow associated therewith. The IC manufacturing system 800 includes a plurality of entities, such as a design house 820, a mask house 830, and an IC manufacturer 850 (i.e., a fab), that interact with one another in the design, development, and manufacturing cycles and/or services related to manufacturing an IC device 860. The various entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 820, mask house 830, and IC manufacturer 850 may be owned by separate companies or by a single company, and may even coexist in a common facility and use common resources.

The design house (or design team) 820 generates an IC design layout (or IC layout) 822. The IC design layout 822 includes various geometrical patterns (e.g., polygons representing metal lines) designed for the IC device 860. The geometrical patterns correspond to IC features in one or more semiconductor layers that make up the IC device 860. Exemplary IC features include active regions, gate electrodes, source and drain features, isolation features, metal lines, contact plugs, vias, and so on. The design house 820 implements appropriate design procedures to form the IC design layout 822. The design procedures may include logic design, physical design, place and route, and/or various design checking operations. The IC design layout 822 is presented in one or more data files having information of the geometrical patterns. For example, the IC design layout 822 can be expressed in a GDSII file format or DFII file format.

The mask house 830 uses the IC design layout 822 to manufacture a set of masks to be used for fabricating the various layers of the IC device 860 according to the IC design layout 822. The mask house 830 performs data preparation 832 and mask fabrication 844. The data preparation 832 translates the IC design layout 822 into a form that can be physically written by a mask writer. The mask fabrication 844 fabricates the set of masks (photomask or reticle).

In the present embodiment, the data preparation 832 includes an automatic-place-and-route (APR) tool 834 configured to determine what regions are low-capacitance regions and what regions are low-resistance regions. The details of the determination will be discussed in association with FIG. 25. The data preparation 832 may produce feedback to the design house 820, which may be used to modify (or adjust) the IC design layout 822 to make it compliant for the manufacturing processes in the fab 850. As discussed above, the APR tool 834 may be implemented by the design house 820, instead of by the mask house 830, in some embodiments. The data preparation 832 may further include other manufacturing flows such as optical proximity correction (OPC), off-axis illumination, sub-resolution assist features, other suitable techniques, or combinations thereof.

After the data preparation 832 prepares data for the mask layers, the mask fabrication 844 fabricates a group of masks including the photomask (e.g., the photomask 736 as in FIG. 16) with transparent regions (or reflective regions) corresponding to the low-capacitance regions. The mask can be formed in various technologies such as binary masks, phase shifting masks, and EUV masks. For example, a binary mask includes a transparent substrate (e.g., fused quartz) and an opaque material (e.g., chromium) coated on the substrate. The opaque material is patterned according to the mask data, thereby forming opaque regions and transparent regions on the binary mask. A radiation beam, such as an ultraviolet (UV) beam, is blocked by the opaque regions and transmits through the transparent regions, thereby transferring an image of the mask to a sensitive material layer (e.g., photoresist) coated on a wafer 852. For another example, an EUV mask includes a low thermal expansion substrate, a reflective multilayer (ML) over the substrate, and an absorption layer over the ML. The absorption layer is patterned according to the mask data. An EUV beam is either absorbed by the patterned absorption layer or reflected by the ML, thereby transferring an image of the mask to a sensitive material layer (e.g., photoresist) coated on the wafer 852. In some embodiments, the fab 850 may also employ some kind of maskless lithography, such as e-beam lithography. For example, one of the masks may be based on an e-beam lithography. In such a case, the data preparation 832 may prepare the direct-write data file for the maskless lithography and the mask fabrication 844 does not make a photomask for those particular subsets to be produced by the maskless lithography.

The IC manufacturer (fab) 850, such as a semiconductor foundry, uses the masks to fabricate the IC device 860 using, for example, lithography processes. The fab 850 may include front-end-of-line (FEOL) fabrication facility and back-end-of-line (BEOL) fabrication facility. Particularly, the fab 850 implements the process flow of method 600

(FIGS. 6A and 6B) to form metallization layers in certain IMD layers on the semiconductor wafer 852.

FIG. 25 illustrates a flow chart of a method 900, constructed according to various aspects of the present disclosure. Embodiments of the method 900 may be implemented by the APR tool 834 (FIG. 24). The method 900 is an example, and is not intended to limit the present disclosure beyond what is explicitly recited in the claims. Additional operations can be provided before, during, and after the method 900, and some operations described can be replaced, eliminated, or relocated for additional embodiments of the method. The method 900 is described below in conjunction with FIG. 26, which graphically illustrate metal lines 456-1 to 456-11 as shown in FIG. 5A.

At operation 902, the method 900 is provided with a layout of an IC. Referring to FIG. 26, an exemplary layout 300 includes geometrical patterns (rectangles in this embodiment) 456-1 to 456-11, each representing a metal line. Each of the metal lines has a width. Particularly, the metal lines 456-3 and 456-8 serving as Vdd lines for an SRAM cell have a width $W_3$, the metal lines 456-2, 456-4, 456-7, 456-9 serving as bit lines for an SRAM cell have a width $W_2$ less than $W_3$, the metal lines 456-1 and 456-5 serving as Vss lines for an SRAM cell have a width $W_1$ less than $W_2$, and the metal lines 456-6, 456-10, and 456-11 serving as word lines for an SRAM cell have a width W4 substantially equal to $W_2$.

At operation 904, the method 900 identifies critical paths that concern resistance more than capacitance, such as by examining voltage drops, as in low-resistance region. The method 900 also identifies critical paths that concern capacitance more than resistance, such as by examining signal integrity against interference, as in low-capacitance region. Alternatively, once low-resistance regions are identified, other regions may be automatically assigned as low-capacitance regions, or vice versa. In some embodiments, metal lines in power grids, such as Vdd and Vss lines, are classified as in low-resistance regions, while signal lines (or tracks) are classified as in low-capacitance regions. In some embodiments, metal lines as bit lines for SRAM in addition to power grids are also classified as in low-resistance regions, while signal lines in SRAM other than bit lines are classified as in low-capacitance regions. In FIG. 26, the rectangular boxes with dash lines with numeral 403 represents the low-capacitance regions, while regions outside of the rectangular boxes represents the low-resistance regions.

At operation 906, the method 900 creates a layout 736' for a photomask (such as the photomask 736 in FIG. 16) with transparent regions (or reflective regions) 403' corresponding to identified low-capacitance regions 403. The photomask allows regions of a photoresist layer above metal lines in the low-capacitance regions to form latent patterns during radiation. The photomask layout 736' (in GDSII file format or DFII file format) is subsequently sent to mask fabrication 844 (FIG. 24) to create the corresponding photomask.

Although not intended to be limiting, one or more embodiments of the present disclosure provide many benefits to a semiconductor device and the formation thereof. For example, embodiments of the present disclosure provide a method that reduce resistance and capacitance in regions sensitive to resistance and regions sensitive to capacitance, respectively. The conductivity of interconnection layers is improved even at the minimum metal line CDs. The method also effectively reduces parasitic capacitance in the interconnect structures. As a result, the RC performance of the device can be improved. Furthermore, the method for forming interconnect structures can be easily integrated into existing semiconductor fabrication processes.

In one exemplary aspect, the present disclosure is directed to a method of fabricating a semiconductor device. The method includes forming a first interconnect layer over a substrate. The first interconnect layer includes a first conductive feature and a second conductive feature. The method also includes forming a patterned mask on the first interconnect layer with one or more openings in the patterned mask overlaying the second conductive feature, recessing the second conductive feature through the one or more openings in the patterned mask, and forming a second interconnect layer over the first interconnect layer. The second interconnect layer has a first via in contact with the first conductive feature and a second via in contact with the second conductive feature. In some embodiments, after the recessing of the second conductive feature, a top surface of the second conductive feature is below a top surface of the first conductive feature. In some embodiments, the top surface of the second conductive feature is below the top surface of the first conductive feature for at least 30 nanometer (nm). In some embodiments, a vertical length of the second via is larger than a vertical length of the first via. In some embodiments, the first conductive feature corresponds to a power grid of the semiconductor device, and the second conductive feature corresponds to a signal line of the semiconductor device. In some embodiments, the first conductive feature corresponds to a bit line in a memory circuit of the semiconductor device, and the second conductive feature corresponds to a word line of the memory circuit. In some embodiments, the method further includes recessing a third conductive feature in the second interconnect layer, the third conductive feature being in contact with the second via. In some embodiments, the forming of the first interconnect layer includes depositing a conductive layer over the substrate, patterning the conductive layer, thereby forming the first and second conductive features, and depositing a dielectric material between the first and second conductive features. In some embodiments, the depositing of the dielectric material caps an air gap between the first and second conductive features. In some embodiments, the method further includes prior to the forming of the patterned mask, depositing an etch stop layer over the first interconnect layer. After the forming of the second interconnect layer, a bottom portion of the first via is in contact with the etch stop layer and the second via is free of contact with the etch stop layer.

In another exemplary aspect, the present disclosure is directed to a method. The method includes forming a first metal line and a second metal line over a substrate, the first and second metal lines having a same thickness, depositing an etch stop layer over the first and second metal lines, removing a portion of the etch stop layer, thereby exposing the second metal line, partially removing the second metal line, such that the second metal line becomes thinner than the first metal line, depositing a dielectric layer over the first and second metal lines, and forming a third metal line and a via in the dielectric layer, the via connecting the third metal line with one of the first and second metal lines. In some embodiments, the first and second metal lines extend lengthwise in a first direction, and the third metal line extends lengthwise in a second direction perpendicular to the first direction. In some embodiments, the first and second metal lines include a first metal, and the third metal line includes a second metal different from the first metal. In some embodiments, the first metal is a noble metal. In some embodiments, the via connects the third metal line with the first metal line, and a sidewall of the via is in contact with the etch stop layer. In some embodiments, the via connects the third metal line with the second metal line, and the via is free of contact with the etch stop layer. In some embodiments, the first metal line corresponds to a power line of a memory device, and the second metal line corresponds to a signal line of the memory device.

In yet another exemplary aspect, the present disclosure is directed to a semiconductor device. The semiconductor device includes a substrate, and a metallization layer disposed over the substrate. The metallization layer includes a first metal line and a second metal line, a bottom surface of the first metal line is coplanar with a bottom surface of the second metal line, and a top surface of the first metal line is above a top surface of the second metal line. In some embodiments, the first and second metal lines are in a memory cell of the semiconductor device. In some embodiments, the first metal line is a power supply line or a bit line for the memory cell and the second metal line is a word line for the memory cell.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

forming a first interconnect layer over a substrate, the first interconnect layer including a first conductive feature and a second conductive feature, wherein the forming of the first interconnect layer includes:

depositing a conductive layer over the substrate, patterning the conductive layer, thereby forming the first and second conductive features, and depositing a dielectric material between the first and second conductive features;

forming a patterned mask on the first interconnect layer, one or more openings in the patterned mask overlaying the second conductive feature;

recessing the second conductive feature through the one or more openings in the patterned mask; and forming a second interconnect layer over the first interconnect layer, the second interconnect layer having a first via in contact with the first conductive feature and a second via in contact with the second conductive feature.

2. The method of claim 1, wherein after the recessing of the second conductive feature, a top surface of the second conductive feature is below a top surface of the first conductive feature.

3. The method of claim 2, wherein the top surface of the second conductive feature is below the top surface of the first conductive feature for at least 3 nanometer (nm).

4. The method of claim 1, wherein a vertical length of the second via is larger than a vertical length of the first via.

5. The method of claim 1, wherein the first conductive feature corresponds to a power grid of the semiconductor device, and wherein the second conductive feature corresponds to a signal line of the semiconductor device.

6. The method of claim 1, wherein the first conductive feature corresponds to a bit line in a memory circuit of the semiconductor device, and wherein the second conductive feature corresponds to a word line of the memory circuit.

7. The method of claim 1, further comprising:

recessing a third conductive feature in the second interconnect layer, wherein the third conductive feature is in contact with the second via.

8. The method of claim 1, wherein the conductive layer includes a noble metal.

9. The method of claim 1, wherein the depositing of the dielectric material caps an air gap between the first and second conductive features.

10. The method of claim 1, further comprising:

prior to the forming of the patterned mask, depositing an etch stop layer over the first interconnect layer, wherein after the forming of the second interconnect layer, a bottom portion of the first via is in contact with the etch stop layer and the second via is free of contact with the etch stop layer.

11. A method, comprising:

forming a first metal line and a second metal line over a substrate, the first and second metal lines having a same thickness;

depositing an etch stop layer over the first and second metal lines;

removing a portion of the etch stop layer, thereby exposing the second metal line;

partially removing the second metal line, such that the second metal line becomes thinner than the first metal line;

depositing a dielectric layer over the first and second metal lines; and forming a third metal line and a via in the dielectric layer, the via connecting the third metal line with one of the first and second metal lines.

12. The method of claim 11, wherein the first and second metal lines extend lengthwise in a first direction, and wherein the third metal line extends lengthwise in a second direction perpendicular to the first direction.

13. The method of claim 11, wherein the first and second metal lines include a first metal, and wherein the third metal line includes a second metal different from the first metal.

14. The method of claim 13, wherein the first metal is a noble metal.

15. The method of claim 11, wherein the via connects the third metal line with the first metal line, and wherein a sidewall of the via is in contact with the etch stop layer.

16. The method of claim 11, wherein the via connects the third metal line with the second metal line, and wherein the via is free of contact with the etch stop layer.

17. The method of claim 11, wherein the first metal line corresponds to a power line of a memory device, and wherein the second metal line corresponds to a signal line of the memory device.

18. A method, comprising:

forming a memory cell;

forming a first interconnect layer over the memory cell, the first interconnect layer including a first metal line coupled to a power supply port or a bit line port of the memory cell and a second metal line coupled to a word line port of the memory cell, a thickness of the first metal line being equal to a thickness of the second metal line;

reducing the thickness of the second metal line, such that the thickness of the first metal line is greater than the thickness of the second metal line; and forming a second interconnect layer over the first interconnect layer, the second interconnect layer including a first via coupled to the first metal line and a second via coupled to the second metal line.

19. The method of claim 18, wherein a height of the first via is less than a height of the second via.

20. The method of claim 18, wherein the first and second metal lines include a noble metal.

* * * * *